United States Patent
Sakamoto et al.

(10) Patent No.: US 7,220,921 B1
(45) Date of Patent: May 22, 2007

(54) SHEET-LIKE BOARD MEMBER AND METHOD OF MANUFACTURING A SEMICONDUCTOR DEVICE

(75) Inventors: Noriaki Sakamoto, Gunma (JP); Yoshiyuki Kobayashi, Gunma (JP); Junji Sakamoto, Gunma (JP); Shigeaki Mashimo, Gunma (JP); Katsumi Okawa, Gunma (JP); Eiju Maehara, Gunma (JP); Kouji Takahashi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 133 days.

(21) Appl. No.: 09/678,142

(22) Filed: Oct. 3, 2000

(30) Foreign Application Priority Data

May 9, 2000 (JP) .................................... 2000-135283

(51) Int. Cl.
*H01R 12/04* (2006.01)
*H05K 1/11* (2006.01)

(52) U.S. Cl. .................. 174/261; 174/255; 174/260; 29/831; 29/832

(58) Field of Classification Search ......... 174/260–266, 174/250, 255; 361/767–771, 783; 29/831, 29/832
See application file for complete search history.

(56) References Cited

U.S. PATENT DOCUMENTS

| 4,447,857 | A | * | 5/1984 | Marks et al. | 174/52.5 |
| 5,493,075 | A | * | 2/1996 | Chong et al. | 174/250 |
| 5,796,590 | A | * | 8/1998 | Klein | 174/260 |
| 6,042,682 | A | * | 3/2000 | Funaya et al. | 156/273.3 |
| 6,329,605 | B1 | * | 12/2001 | Beroz et al. | 174/256 |
| 6,377,464 | B1 | * | 4/2002 | Hashemi et al. | 257/516 |

FOREIGN PATENT DOCUMENTS

JP 08-204103 8/1996
JP 11-126952 5/1999

OTHER PUBLICATIONS

VSLI (Chinese text).

* cited by examiner

*Primary Examiner*—David Zarneke
*Assistant Examiner*—Jeremy Norris
(74) *Attorney, Agent, or Firm*—FIsh & Richardson P.C.

(57) ABSTRACT

In the present invention there is formed a sheet-like board member 50 having conductive coating films, such as first pads 55 and die pads 59, formed thereon or a sheet-like board member 50 which has been half-etched by using conductive coating films such as first pads 55 and die pads 59. A hybrid IC can be manufactured by means of utilization of post-processing processes of a semiconductor manufacturer. Further, a hybrid IC can be manufactured without adoption of a support board, and hence there can be manufactured a hybrid IC which is of lower profile and has superior heat dissipation characteristics.

6 Claims, 17 Drawing Sheets

SHEET-LIKE BOARD MEMBER AND METHOD OF MANUFACTURING A SEMICONDUCTOR DEVICE

BACKGROUND OF THE INVENTION

1. Field of the Invention

The present invention relates to a sheet-like board member and a method of manufacturing a semiconductor device and, more particularly, to solution of various problems inherent to a known hybrid IC.

2. Description of the Related Art

Since a circuit device to be mounted on an electronic appliance has conventionally been adopted by a portable cellular phone or a portable computer, demand exists for realization of a more compact circuit device of lower profile and lighter weight.

A hybrid IC has frequently been used as a circuit device. A ceramic board, a metal board, a printed board, or a flexible sheet board has predominantly been employed as a board for use with the hybrid IC.

FIG. 17 shows an example board for use with a hybrid IC. The structure of the board will be specifically described hereinbelow. A conductive pattern is formed from Cu on a board 1. The conductive pattern is a wiring 6 which is integrally formed with die pads 2, bonding pads 3, outer lead electrodes 4, and pads 5 on which passive elements 9, such as chip resistors or chip capacitors, are mounted. The wiring 6 is patterned into a desired geometry in accordance with the circuit of the hybrid IC.

A semiconductor element 7 is mounted on the die pad 2, and bonding electrodes provided on the semiconductor element 7 are electrically connected to the corresponding bonding pads 3 by using bonding wires 8. The passive element is mounted on each of the pads 5, by means of brazing material such as solder or Ag paste. An external lead 10 is fixedly connected to each of the outer lead electrodes 4 through use of brazing material or Ag paste. In consideration of environmental resistance, the hybrid IC is sealed by molding. More specifically, insulating resin 11 is formed over the entire surface of the board 1 through molding.

In another case, a hybrid IC is embodied through use of a lead frame 20. FIGS. 18A and 18B show an embodiment of the hybrid IC shown in FIG. 17 which is realized through use of the lead frame 20.

A semiconductor element 22 is mounted on an island 21, and bonding pads 23 provided in the vicinity of the island 21 are electrically connected to the semiconductor element 22 by using bonding wires 24.

Of the bonding pads 23, some bonding pads 23 may be integrally formed with a wiring 25. For example, one or more of the bonding pads 23 is electrically connected to a lead terminal 26. A plurality of lead terminals 26 are provided on the side of the lead frame 20. Reference numeral 27 designates a passive element, and reference numeral 28 designates a die pad on which the passive element 27 is mounted.

Since the hybrid IC shown in FIG. 17 employs the board 1, the thickness and weight of the hybrid IC are increased by the amounts corresponding to the board 1. Further, a limitation is imposed on a reduction in costs. Particularly, at the time of formation of conductive patterns 2 through 6 formed from Cu foil on the board 1, the manufacturing process is additionally provided a step of patterning the board 1 after adhesion of a Cu foil to the board 1. The board 1 having a Cu pattern formed thereon adds to the cost of a hybrid IC. Further, the board 1 is utilized as a support board for forming conductive patterns 2 through 6, and hence the board 1 is necessary.

Use of a board poses a problem in connection with the dissipation of heat from a semiconductor element or passive element mounted on the board. For example, a printed board, a ceramic board, and a flexible sheet are formed from insulating material. Even when an attempt is made to dissipate heat to a substrate by using a board, the heat developing in a sealed semiconductor element or passive element cannot be dissipated well to the outside, because of poor thermal conductivity of the board. Even in the case of a metal board having superior heat dissipation properties, the surface of the metal board is coated with insulating plastic in order to prevent occurrence of an electrical short circuit between conductive patterns and the metal board. The plastic coating induces thermal resistance. If the temperature of a semiconductor element is lowered, the drive performance of the semiconductor element can be improved further. In spite of this fact, the performance of a semiconductor element cannot be sufficiently utilized because of poor dissipation properties of the board.

In contrast with a packaged discrete element or packaged semiconductor chip, a hybrid IC is equipped with many active and passive elements. Further, wirings for electrically interconnecting semiconductor elements are used in great numbers. Depending on the number of elements to be mounted on a board, the board is large, and very long wirings are laid on the board. Therefore, deformation of a board, such as warpage of a board, must be taken into consideration. Even if miniaturization of a conductive pattern is achieved in accordance with a tendency toward a smaller and thinner pattern of lighter weight, a support board is required for supporting narrow and long wirings without involvement of deformation such as warpage.

Consideration is given to manufacturing processes. Data pertaining to a certain pattern are transmitted to a board manufacturer from a hybrid IC manufacturer. The board manufacturer manufactures a board by means of forming the pattern on a board. The hybrid IC manufacturer purchases the thus-finished board. Thus, a great amount of time is consumed before manufacture of a hybrid IC. Accordingly, the hybrid IC manufacturer cannot supply hybrid ICs to a user within a short period of time.

In addition to the problem described in connection with FIG. 17, the hybrid IC employing the lead frame 20 shown in FIG. 18 encounters the following problems.

Since the lead frame 20 is formed by means of selectively removing material from front to back through use of the pressing technique, or through use of the etching technique, measures are taken in order to prevent lead terminals 26 and an island 21 from coming apart. More specifically, the lead terminals 26 are provided with a tie bar 29, and the island 21 is provided with suspension leads 30. The tie bar 29 and the suspension leads 30 are not originally required. Hence, there is additionally required a step of removing the tie bar 29 and the suspension leads 30 after molding of the hybrid IC.

Since a wiring 25 is laid narrowly and lengthy, the wiring 25 also requires suspension leads 31 in order to prevent deformation of the wiring 25, such as warpage. Accordingly, as mentioned previously, there is additionally required a step of removing the suspension leads 31. Further, presence of the suspension leads 30 and 31 hinders formation of other wirings, pads, or islands. Particularly, in order to prevent occurrence of intersection between wirings, a complicated pattern is required.

Since the lead frame 20 is selectively removed from front to back so as to have a predetermined pattern by means of etching or pressing, a limitation is imposed on miniaturization of a lead pattern. This also applies to the conductive pattern shown in FIG. 17.

In a case where the lead frame 20 is formed by means of, for example, pressing, a pitch between leads to be punched is said to be limited to a width substantially equal to the thickness of the lead frame 20. In a case where the lead frame 20 is formed by means of etching, the lead frame 20 is etched to a depth corresponding to the thickness of the lead frame 20, in both the longitudinal and lateral directions. Therefore, the pitch between leads is said to be limited to the thickness of the lead frame 20.

When an attempt is made to miniaturize the pattern of the lead frame 20, the thickness thereof must be reduced. If the thickness of the lead frame 20 itself is reduced, the strength of the lead frame 20 is also reduced, which may in turn cause problems such as warpage of the lead frame 20 or deformation and misregistration of the lead terminals 26. Particularly, since the end of each of bonding pads 23 to be connected to a fine metal wiring 24 is unsupported, the end of the bonding pad 23 may be susceptible to warpage or deformation.

Further, arrows shown in FIG. 18A designate areas from which lead terminals 26 protrude from the side surfaces of a semiconductor package, and an upper metal mold 32 cannot be brought into contact with a lower metal mold 33 within a space defined between the lead terminals 26. This may cause generation of burrs in these areas.

As mentioned above, miniaturization of the lead frame 20 encounters limitation, thereby hindering further miniaturization of the overall semiconductor package. From the viewpoint of processes, there may be required a method of preventing warpage of the lead frame 20, a step of removing burrs, and a necessity of removing the suspension leads 7 and the tie bar 8, thereby complicating manufacturing processes. Further in a step of removing a tie bar 8, leads are easy to be bent or drawn out from the package. Therefore reliability is apt to be lowered.

SUMMARY OF THE INVENTION

The present invention intends to obtain a reliable and easy to manufacture lead frame. The present invention has been conceived in light of the previously-described problems of the background art and is aimed at solving the problems by means of providing a sheet-like board member including a first planar surface and a second planar surface provided opposite the first surface, comprising:

mask which is formed on the second surface and is substantially identical with a plurality of first pads formed in a semiconductor element mount region or in the vicinity of the semiconductor element mount region.

According to the above structure, lead frame can be obtained easily only by etching the sheet like plate member through the mask. Further since the sheet like board member is a plane plate, there is few possibility to be damaged. Therefore warp or deformation does not generated and easy to handle the lead frame can be obtained.

Preferably the mask is made of a conductive film.

Preferably, the mask is made of a photoresist. Further the sheet like board member can be made of two layered structure. In the case, lead frame whose die pad (region in which chip is to be mounted) has a different level from bonding pad formed at the end of the lead, can be formed easily, by removing a part of resist such as resist formed on the die pad (the chip mounting region) after first etching step, and then etching secondly.

Preferably the mask is formed on a region corresponding to a wiring directly or integrally connected to the first pad.

Preferably, the first pads are bonding pads or pads on which solder balls are to be fixed.

Preferably, a conductive coating film or a photoresist film which is substantially identical with a die pad is provided in the semiconductor element mount region.

Preferably, in a conductive coating film or photoresist film which is substantially identical with a passive element mount pad and/or outer lead electrode is formed on the second surface.

A conductive pattern formed in the form of a sheet-like board member is half etched, wherewith a conductive pattern supported by a sheet-like board member can be formed. So long as a hybrid IC manufacturer has a photolithography apparatus, the manufacturer can perform operations through every phase of manufacture, from processing of a sheet-like board member to fabrication of a hybrid IC.

In the process of mounting a semiconductor element, establishing electrical connection using a bonding wire, and a sealing process using insulating resin, the sheet-like board member can be used as a support board. As a result, a board such as that which has been conventionally used as a support board, becomes obviated. Bonding pads and die pads are present in the form of islands and are located unstably. Since the bonding pads and die pads (islands) are formed integrally, and hence deformation such as warpage can be eliminated. Further, wirings are routed long and may be susceptible to warpage or distortion. However, the wirings are formed integrally with the sheet-like board member, and hence problems, such as distortion or warpage, can be prevented.

A pitch between leads can be made smaller, by means of stopping pressing or etching of the board member at an intermediate position, without involvement of full pressing or etching of the board member from front to back. Thus, a finer pattern can be formed. Since leads or leads and islands are integrally formed with the board member, warpage or deformation of leads can be prevented, thereby obviating a tie bar of leads or suspension leads. Moreover, after the board member has been fully encapsulated in insulating plastic, leads or islands can be separated by means of abrading or etching the underside of the board member. As a result, leads or islands can be placed in predetermined positions without involvement of positional displacements. Even when leads are routed over a long distance, the leads can be placed in position without involvement of any problem.

Preferably, the sheet-like board member is formed from a conductive foil, and the conductive coating film is formed from material differing from that of the conductive foil.

Preferably the passive element is chip resistor or chip condenser.

Preferably pattern substantially same as a guide pin or guide hole to be inserted by guide pin on sides opposite to each other.

Preferably the sheet like board member is made of pressed metal.

As a result of a conductive coating film being formed from material differing from that of a conductive foil, the conductive coating film can be used as an etching mask. Further, an anvil-shaped structure can be formed in the conductive coating film, thereby imparting an anchoring effect to a conductive pattern.

The present invention also provides a sheet-like board member including a first planar surface and a second planar surface on which protuberances of desired heights are formed and which is provided opposite the first planar surface, wherein the protuberances constitute a plurality of first pads in a semiconductor element mount region and the vicinity thereof.

Preferably, the protuberances constitute the wirings integrally formed with the first pads.

Preferably, the protuberances constitute second pads integrally formed with the wiring.

Preferably, the first pads and/or second pads are bonding pads, or pads on which solder balls or bumps are to be mounted.

Preferably, the protuberances constitute die pads to be provided in the semiconductor element mount region.

Preferably, the protuberances constitute passive element mount pads and/or outer lead electrodes.

So long as a sheet-like board member in which a conductive pattern is formed into a protuberance is employed, packaging of a semiconductor element, establishing electrical connection between the sheet-like board member and pads, encapsulation of the semiconductor device can be effected in a post-processing process of a semiconductor manufacturer. Thus, as in the case of a known lead frame, so long as a lead frame manufacturer supplies a sheet-like board member, a semiconductor manufacturer can manufacture a hybrid IC.

In the process of mounting a semiconductor element, establishing electrical connection using a bonding wire, and a sealing process using insulating resin, the sheet-like board member can be used as a support board. As a result, a board such as that which has been conventionally used as a support board, becomes obviated. Bonding pads and die pads (islands) are present in the form of islands and are located unstably. Since the bonding pads and die pads are formed integrally, and hence deformation such as warpage can be eliminated. Further, wirings are routed long and may be susceptible to warpage or distortion. However, the wirings are formed integrally with the sheet-like board member, and hence problems, such as distortion or warpage, can be prevented.

A pitch between leads can be made smaller, by means of stopping pressing or etching of the board member at an intermediate position, without involvement of full pressing or etching of the board member from front to back. Thus, a finer pattern can be formed. Since leads or leads and islands are integrally formed with the board member, warpage or deformation of leads can be prevented, thereby obviating a tie bar of leads or suspension leads. Moreover, after the board member has been fully encapsulated in insulating plastic, leads or islands can be separated by means of abrading or etching the underside of the board member. As a result, leads or islands can be placed in predetermined positions without involvement of positional displacements. Even when leads are routed over a long distance, the leads can be placed in position without involvement of any problem.

Preferably the passive element is chip resistor or chip condenser.

Preferably pattern substantially same as a guide pin or guide hole to be inserted by guide pin on sides opposite to each other.

Preferably pattern made of the protuberance as one unit is disposed in matrix.

Preferably, a conductive coating film is formed on the protuberance from material differing from that of the protuberance.

Preferably, the side surfaces of protuberance are imparted with an anchoring structure.

Preferably, the conductive coating film has an anvil-shaped structure in the vicinity of the upper surface of the protuberance.

Preferably, the conductive coating film is formed from Ni, Au, Ag, or Pd.

In a case where the board member is primarily formed from Cu and where a conductive coating film is made of Ni, Ag, Au, or Pd, the conductive coating mask can be utilized as an etching mask. The side surfaces of leads or islands can be formed so as to assume a curved structure, and an anvil-shaped structure can be form in the vicinity of the surface of respective lead or island from the conductive coating film. Moreover, connection of a bonding wire or mounting of a semiconductor element can be effected through use of this material at one time.

The present invention provides a sheet-like board member including:

a first face whose portions to be encapsulated in plastic are wholly planar;

a sheet-like second side of predetermined thickness which is provided on the underside, wherein a plurality of first pads to be formed in a semiconductor element mount region or the vicinity thereof and protuberances which are to become wirings integrally formed with the first pads are formed within a region enclosed by an abutting region which is brought into contact with an upper metal mold; and a sealed space which is defined between the second side and the upper metal mold and at least within the area of the second side enclosed by the abutting region.

Preferably present invention provides a method of manufacturing a semiconductor device comprising the steps of:

preparing a sheet-like board member, the sheet-like board member including a first surface of a planar surface and a second surface of a planar surface disposed opposite to the first surface, on which a mask pattern corresponding to a plurality of first pads to be formed in a semiconductor element mount region or the vicinity thereof;

forming protuberances on a region corresponding to the first pad, by etching a part of the second surface through the mask to make the second surface except for the region corresponding to the first pad being lower level;

mounting a semiconductor chip on the element mount region and electrically connecting to the chip through the first pad;

placing the sheet-like board member in a metal mold and filling, with resin, the space defined between the lead frame and the upper metal mold; and partially removing the lead frame exposed through the underside of the filled plastic and separating the protuberances into pieces.

Preferably after forming protuberances, the steps further comprises the steps of removing mask formed on the element mount region; lowering a level of the element mount region to be a level between a surface of the protuberances and a level of a region except for the element mount region so that the level of the element mount region is lower than the level of the bonding pad.

Nowadays it is required to make the level of die pad lower in order to prevent a short circuit to die pad level. According to the above method, the level can be obtained easily by selectively removing the mask.

The present invention provides a method of manufacturing a semiconductor device comprising:

a step of preparing a sheet-like board member, the sheet-like board member including an underside whose portions to be encapsulated in plastic are wholly planar, and a plurality of first pads to be formed in a semiconductor element mount region or the vicinity thereof and protuberances which are to become wirings integrally formed with the first pads are formed within a region enclosed by an abutting region which is brought into contact with an upper metal mold;

a step of mounting a semiconductor element in the semiconductor element mount region and electrically connecting the first pads to the semiconductor element;

a step of placing the sheet-like board member in a metal mold and filling, with resin, the spaced defined between the lead frame and the upper metal mold; and a step of partially removing the lead frame exposed through the underside of the filled plastic and separating the protuberances into pieces.

Preferably, the entire underside of the sheet-like board member corresponding to the area which is to be encapsulated in plastic is brought into contact with a lower metal mold.

Since a board member is formed in the form of a sheet, the underside of the board member is brought into contact with the entire lower metal mold. A conductive pattern such as pads is provided within the hermetically-sealed space, and hence production of burrs, which has been described previously is eliminated completely.

By means of the foregoing methods, a semiconductor package is formed from leads or conductive patterns, a semiconductor, and insulating plastic for encapsulating the conductive patterns and the semiconductor element. Therefore, the present invention enables realization of a more compact semiconductor package which is of lower profile. Since conductive paths are embedded, exfoliation of the conductive paths from insulating plastic is prevented. A conductive coating film is formed on the surface of a conductive foil, thereby enabling formation of leads and islands, in which an anvil-shaped structure is formed in the vicinity of the surface of the conductive coating film, thereby producing an anchoring effect.

Preferably sucking means is provided in disperse in a sheet like frame member mount region in contact with the lower die.

Preferably, the conductive paths are made of pressed metal.

In the present invention, since a plate like member is used as a conductive plate for forming conductive path pattern and an isolation trench is formed by half punching or half etching to form conductive paths, conductive paths whose sheet resistance is very low, whose pattern is fine and whose surface is very flat, can be obtained.

Therefore, bonding reliability is very high and in the case of mounting a high-integrated semiconductor circuit, high accuracy and reliability in the high-integrated semiconductor circuit device can be realized.

According to using a pressed metal as a conductive plate, boundaries are positioned at random, thereby sheet resistance is low and fine and very flat conductive paths in microscopic views can be obtained.

In the case that plating film whose thickness is formed so thick as to be able to use as conductive paths, film thickness is deviated and a sufficient flatness cannot be obtained. For example, when a plating film whose thickness is 20–35 µm is formed, it is difficult to have an uniform thickness of the plating film. Therefore bonding strength is lowered.

Contrary that, in the case if conductive paths formed by half etching a pressed metal such as copper foil, the surface of the conductive paths is very flat and bonding accuracy and bonding reliability are very high.

In the plating film, according to using a mirror polished surface of a substrate as a growth starting face of plating, then removing the substrate and using the growth starting face as a bonding face, flatness of the bonding surface is slightly improved. However accuracy in the case is inferior to use the pressed metal such as cooper.

DESCRIPTION OF THE PREFERRED EMBODIMENTS

First Embodiment for Describing a Sheet-Like Board Member

Figure 1A:
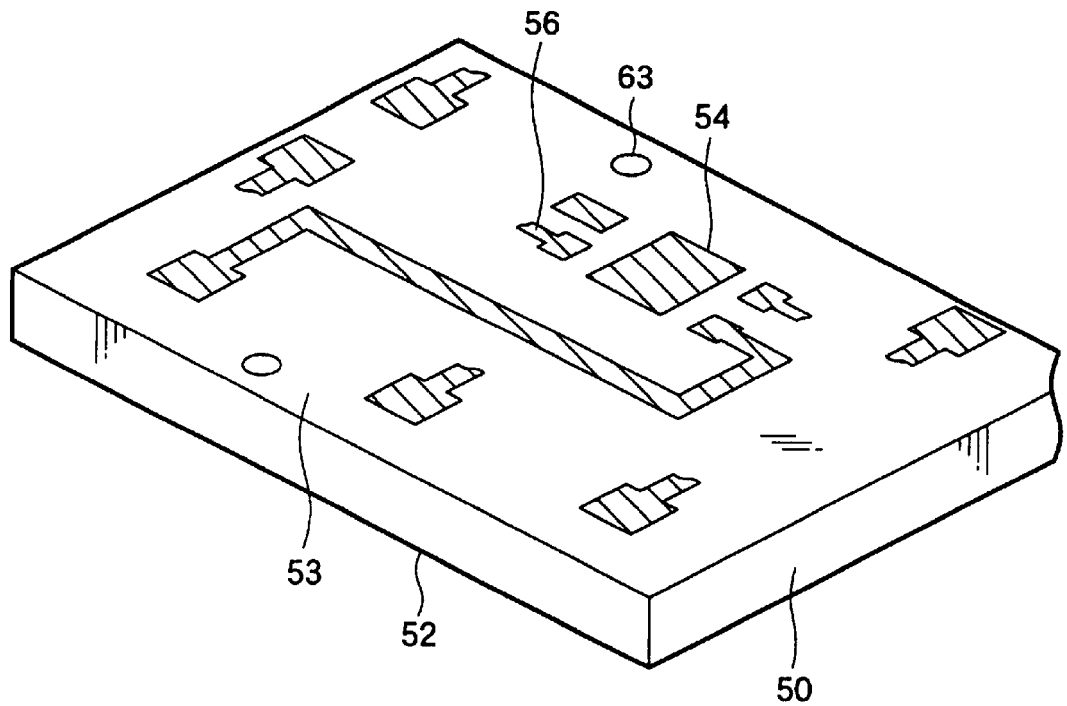
FIGS. 1A and 1B are schematic representations for describing a sheet-like board member according to the present invention.

FIG. 1A shows a sheet-like board member capable of embodying a semiconductor package which is of lower profile and superior reliability, in terms of encapsulation, to a known hybrid IC or a hybrid IC employing a lead frame.

As shown in FIG. 1A, in a sheet-like board member 50, the pattern of a known hybrid IC is formed from a conductive coating film 56.

The sheet-like board member 50 comprises a first planar surface 52, and a second planar surface 53 provided opposite the first planar surface 52.

On the second planar surface 53, a first conductive coating film 56 is formed into a pattern substantially identical with a plurality of first pads 55 provided in a semiconductor element mount region 54, or in the vicinity of the semiconductor element mount region 54.

In lieu of the conductive coating film 56, an etching-resistant mask such as a photoresist mask may be formed on the sheet-like board member 50. In this case, the conductive coating film 56 is formed on at least areas corresponding to bonding pads, and areas to be formed patterns are covered with the etching-resistant mask.

The present invention is characterized by the sheet-like board member 50. As will be evident from the subsequent description, the sheet-like board member 50 is half-etched using the conductive coating film 56 or photoresist film provided on the board member 50 as a mask, and a semiconductor element 57 is mounted on the board member 50. The semiconductor element 57 and the sheet-like board 50 are encapsulated in insulating plastic 58. The portion of the sheet-like member 50 exposed through the back of the insulating plastic 58 is processed by means of etching, abrasion, or grinding, until the first pad 55 is separated. By means of employing this method, a semiconductor package can be formed from three materials; that is, the semiconductor element 57, the first pad 55, and the insulating plastic 58 encapsulating the first pad 55. The sheet-like board member 50 can be finally caused to act as a hybrid IC.

The principal characteristic of the structure of the semiconductor package according to the present invention lies in that an etching-resistant mask is formed on the surface of the sheet-like board member 50 such that the sheet-like board member 50 can be half-etched.

Etching reaction usually takes place in both vertical and horizontal directions. This phenomenon becomes particularly noticeable in the case of isotropic etching, in which the vertical depth of etching becomes substantially identical with the horizontal length of etching. In the case of anisotropic etching, the horizontal length of anisotropic etching is much shorter than that of isotropic etching. In any event, anisotropic etching involves occurrence of horizontal etching reaction.

In a case where a lead frame is punched from front to back, the areas between conductive patterns are etched horizontally. Therefore, the pitch between the first pad 55 and an adjacent conductive pattern cannot be made smaller than a certain limiting value, thus rendering formation of a minute pattern difficult.

However, if the conductive coating films 56 or a photoresist film is formed on the sheet-like board member 50 and the sheet-like board member 50 is subjected to half etching, the vertical depth of etching can be made smaller, thereby reducing the horizontal length of etching. As a result, formation of a finer first pad 55 can be achieved.

The same also applies to other conductive patterns; for example, a die pad 59, wiring 60, a pad 61, and external electrodes 62. The wiring 60, connects for example between the pad 61 and external electrodes 62. These elements will be collectively called a conductive patterns.

For example, a conductive coating film 56 made of Ni, Ag, or Au is patterned on the sheet-like board member 50 of 2 ounces (70 μm). The sheet-like board member 50 is etched while the conductive coating film 56 is used as a mask, until etching completely penetrates through the sheet-like board member 50. The pitch between the patterns of thus-produced conductive coating film 56 assumes the narrowest pitch; that is, the pitch assumes a value of substantially 70 μm. In a case where the sheet-like board member 50 is etched to a depth of 35 μm while the conductive coating film 56 is utilized as an etching-resistant mask, the pitch between conductive patterns can be made narrow, to a value of substantially 35 μm. As a result, the packaging efficiency of a semiconductor package can be doubled. The shallower the depth to which the sheet-like board member 50 is to be etched, the finer a pattern becomes.

In view of etching facilities, productivity, and manufacturing costs, the sheet-like board member 50 is preferably subjected to wet etching. Wet etching is non-anisotropic etching. In a comparatively large number of cases, wet etching is transverse etching. Therefor etching accuracy is difficult to be obtained. According to using half etching of the sheet-like board member 50 by using the conductive coating film 56 or a photoresist film as a mask, over etching in transverse direction is reduced in comparison with that of whole etching. For this reason, this method is superior in terms of formation of a finer conductive pattern.

A conductive pattern appears, by means of half etching of the sheet-like board member 50 by using the conductive film 56 or a photoresist film as a mask, and the conductive pattern is integrally formed with the sheet-like board member 50, thereby obviating formation of a tie bar or suspension leads. Therefore, there can be eliminated a process of removing a tie bar or suspension leads after encapsulation of the semiconductor element 57 in the insulating plastic 58.

In the sheet-like board member 50 according to the present invention, a conductive pattern is formed integrally with the sheet-like board member 50. So long as the sheet-like board member 50 is fixed, neither misregistration nor warpage of a conductive pattern arises.

Thus, the present invention has a characteristic of providing the ability to stably bond a bonding wire to a first pad 61. Further, suspension leads are not required, and hence a necessity for taking into consideration intersection between suspension leads can be eliminated. Thus, the present invention yields an advantage of ability to lay a conductive pattern in an arbitrary position.

If guide holes 63 are formed in the sheet-like board member 50, the guide holes 63 will be convenient for placing the sheet-like board member 50 into metal molds.

The guide holes 63 are formed by means of patterning, in corresponding positions on the sheet-like board member 50, a conductive coating film or a photoresist film into circular patterns which are substantially identical in shape with guide pins. Before molding of the sheet-like board member 50, the guide hole 63 may be formed by means of drilling, punching, or etching the circular patterns. Alternatively, there may be used a sheet-like board member 50 having guide holes 63 formed therein. The sheet-like board member 50 can be molded with high accuracy by means of inserting guide pins of the metal molds into the guide holes 63.

As mentioned above, a conductive pattern is formed by means of half etching the sheet-like board member 50 by using the conductive coating film 56 or a photoresist film. The thus-formed conductive pattern may be adopted as a known lead frame.

A semiconductor device manufacturer usually performs pre-processing operations in one facility, and post-processing operations in another facility. The facility designed for post-processing operations; that is, molding the sheet-like board member 50, is usually not equipped with an etching apparatus. So long as a lead frame manufacturer adopts a facility for forming a conductive coating film and an etching apparatus, a semiconductor manufacturer can produce a hybrid IC from a sheet-like board member by means of purchasing, from a lead frame manufacturer, sheet-like board members, each having a conductive coating film or a photoresist film formed thereon.

Second Embodiment for Describing a Sheet-Like Board Member

Figure 1B:
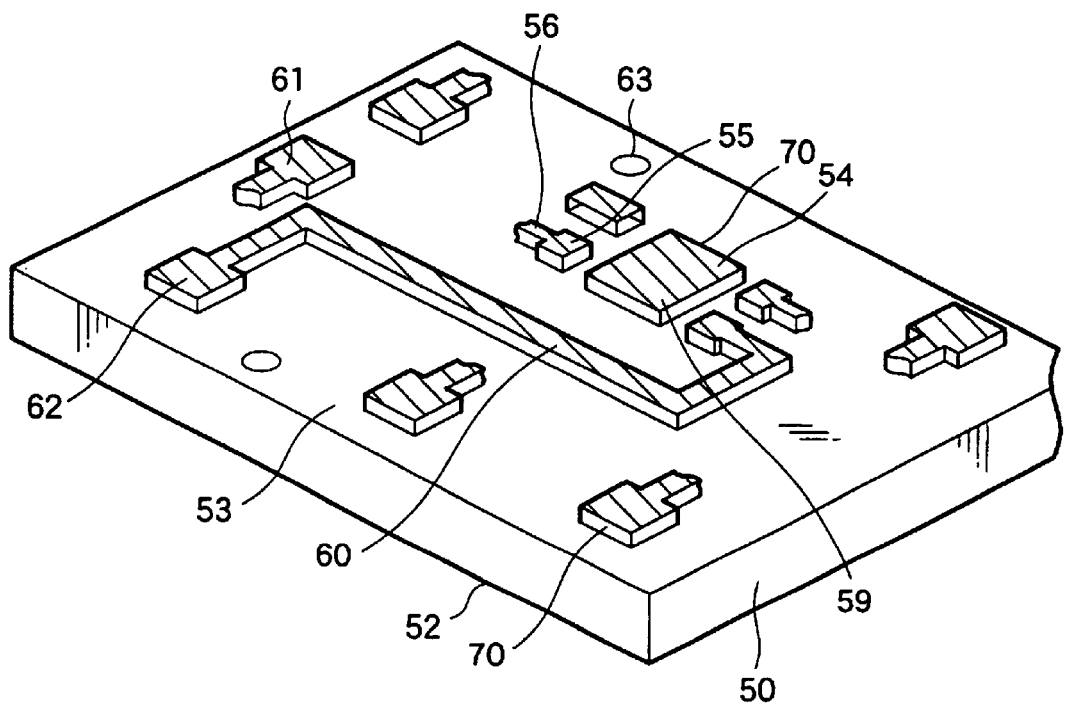
Figure 2:
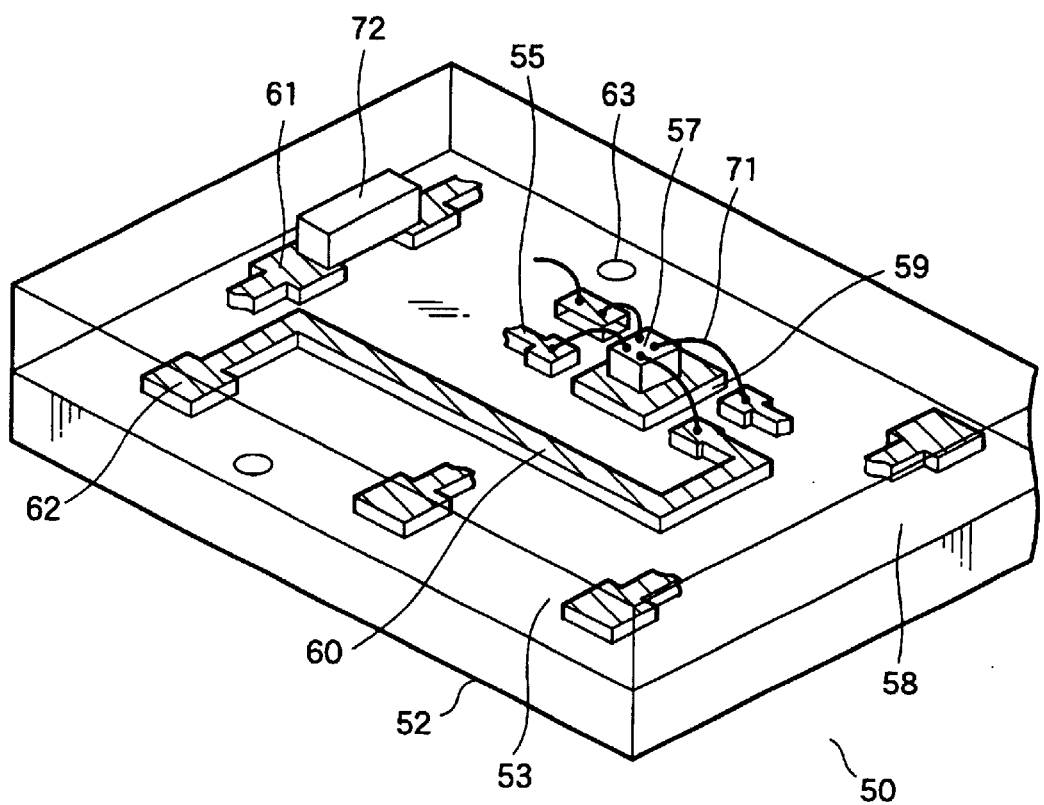
FIG. 2 is a schematic representation for describing a method of manufacturing a semiconductor device which employs a sheet-like board member according to the present invention.

As shown in FIG. 1B, the sheet-like board member 50 is half-etched by using the conductive coating film 56 as a mask, wherewith a conductive pattern is formed in the form of a protuberance. The board member 50 may be half-etched through use of a photoresist film in lieu of the conductive coating film.

The board member 50 comprises the first planar surface 52 and the second surface 53 which is provided opposite the first planar surface 52 and on which protuberances 70 are formed to desired heights.

The protuberance 70 constitutes the semiconductor element mount region 54, or the protuberances 70 constitute a plurality of first pads 55 in the vicinity of the semiconductor element mount region 54.

The sheet-like board member 50 according to the present embodiment is substantially identical with that described in connection with the first embodiment in terms of structure and effect, except that a conductive pattern is half-etched.

An explanation will now be given of half etching of a conductive pattern. In a post-processing process, a semiconductor manufacturer does not have any facility for plating a board member with Cu or a facility for etching a board member through photolithography. So long as a semiconductor manufacturer purchases the sheet-like board members 50, on each of which conductive patterns are formed in the form of protuberances, the board members 50 can be handled in the same manner as a known lead frame, by means of half etching. Accordingly, a semiconductor package can be manufactured from the sheet-like board member 50, through use of existing facilities located in the post-processing processes.

Third Embodiment for Describing a Method of Manufacturing a Semiconductor Device Employing a Sheet-Like Board Member Processes up to and including a process for manufacturing a semiconductor device 73 from the sheet-like board member 50 will now be described, by reference to FIGS. 1A through 3B.

The sheet-like board member 50 is prepared as shown in FIG. 1A. Both the first surface 52 and the second surface 53 are planar, and the conductive coating films 56 or photoresist films which are identical in shape with the pattern of conductive patterns are formed on the second surface 53. Here, conductive patterns are hatched by oblique lines. In a case where photoresist films are employed in lieu of conductive coating films, conductive coating films are formed in at least locations below the photoresist films corresponding to bonding pads (see FIG. 1A with regard to the description thus far).

Subsequently, the sheet-like board member 50 is subjected to half etching by using the conductive coating films 56 or photoresist films as a mask. Preferably, the depth to which the board member 50 is to be etched is less than the thickness of the sheet-like board member 50. The shallower the depth of etching, the finer the pattern that can be formed.

As shown in FIG. 1B, as a result of the sheet-like board member 50 being subjected to half etching, conductive patterns appear in the form of protuberances on the second surface 53 of the board member 50. The sheet-like board member 50 may be a multilayer member made of Cu—Al or Cu—Al—Cu. Particularly, a multilayer member made of Cu—Al—Cu can prevent warpage of the sheet-like board member 50, which would otherwise be caused by difference in coefficient of thermal expansion between constituent layers of the board member 50.

For example, in a case where a semiconductor manufacturer has an etching apparatus installed in a post-processing process, the semiconductor manufacturer purchases the board members 50 shown in FIG. 1A from a lead frame manufacturer. In contrast, if a semiconductor manufacturer does not has any etching apparatus in a post-processing processes, the semiconductor manufacturer can purchase the sheet-like board members 50 on which conductive patterns are formed in the form of protuberances by means of half etching. In this way, a semiconductor manufacturer can readily proceed to the following manufacturing processes, through use of existing facilities and without involvement of introduction of an etching apparatus (see FIG. 1B with regard to the description thus far).

Next, the semiconductor element 57 is fixedly mounted on the semiconductor element mount region 54, and bonding pads of the semiconductor element 57 are electrically connected to corresponding first pads 55. In the drawings, the semiconductor element 57 is mounted face up, and hence bonding wires 71 are adopted as connection means.

During the bonding operation, the first pads 55 are integrally formed with the sheet-like board member 50, and the planar back of the sheet-like board member 50 is in contact with the surface of a table of a bonding machine. If the sheet-like board member 50 is completely fixed on the table of the bonding machine, the first pads 55 are not susceptible to positional displacement, and bonding energy can be efficiently transferred to the bonding wires 71 and the first pads 55 without involvement of misregistration of the first pads 55. Thus, the bonding strength of the bonding wires 71 can be enhanced. The sheet-like board member 50 can be fixed on the table of the bonding machine, by means of forming, for example, a plurality of vacuum suction holes over the entire surface of the table.

In the case of adoption of a face-down semiconductor element, solder balls or bumps made of Au or solder are formed on electrodes of the semiconductor element 57, and the first pads 55 are arranged directly beneath the solder balls or bumps. The first pads 55 and the solder balls or bumps are connected together.

A passive element 72 is mounted on each of die pads 61 by means of brazing material such as solder or a conductive paste such as Ag paste. Here, a chip resistor, a chip capacitor, a printed resistor, or a coil can be adopted as a passive element 72.

The insulating plastic 58 is formed such that the conductive patterns, the semiconductor element 57, and connection means are encapsulated in the insulating plastic 58.

In a case where the sheet-like board member 50 is encapsulated through use of, for example, metal molds, the guide holes 63 are formed in the sheet-like board member 50 during this manufacturing step. Guide pins of the metal molds are inserted into the corresponding guide holes 63, wherewith the sheet-like board member 50 is placed in position with high accuracy. Since the first surface 52 of the sheet-like board member 50 is planar, the surface of a lower metal mold with which the back of the board member 50 is brought into contact is also formed planar.

Subsequently, the insulating plastic 58 is poured into the metal molds, and may be either thermoplastic insulating material or thermosetting insulating material.

The sheet-like board member 50 can be encapsulated in the insulating plastic 58 by means of transfer molding, injection molding, dipping, or coating. Thermosetting resin, such as epoxy resin, can be used as plastic material for transfer molding purpose. Thermoplastic resin such as liquid-crystal polymer, polyphenylene sulfide, or the like can be used as plastic material for injection molding purpose.

In the present embodiment, the insulating plastic 58 is controlled so as to be built to a thickness of about 100 μm from the top of the bonding wires 71. The thickness of the insulating plastic 58 can be increased or decreased in consideration of strength of a semiconductor device.

Since conductive patterns are formed integrally with the sheet-like board member 50 by means of molding, positional displacement of conductive patterns does not arise at all, unless the board member 50 otherwise includes positional displacement. Even in this case, the sheet-like member 50 can be fixed on a lower metal mold by means of vacuum suction.

Conductive patterns formed in the form of protuberances and the semiconductor element 57 are encapsulated in the insulating plastic 58. The portion of the board member 50 located below the protuberances is exposed (see FIG. 2 with regard to the description thus far).

Subsequently, the exposed portion of the sheet-like board member 50 on the back of the insulating plastic 58 is removed, whereupon the conductive patterns are separated into pieces.

Separation of the board member 50 is considered to be effected in various ways. For example, the back of the board member 50 may be removed by means of etching, by means of abrasion or grinding, or by means of a combination thereof. If the back of the board member 50 is ground until the insulating plastic 58 becomes exposed, shavings of the board member 50 or burr-like metal flakes extending outside of the board member 50 are engaged in the insulating plastic 58. In order to prevent occurrence of such a problem, grinding of the board member 50 is stopped before exposure of the insulating plastic 58. Subsequently, the conductive patterns are separated into pieces by means of etching, thereby preventing metal of the board member 50 from being engaged in the insulating plastic 58 located between the conductive patterns. Thus, occurrence of an electrical short circuit in a narrow space defined between leads can be prevented.

In the case of using a half etching operation, variations are easy to arise in a etching depth. The variation of etching depth case variations of thickness of the insulating plastic 58. In order to prevent occurrence of such variations, the insulating plastic 58 is ground to a target thickness by means of abrasion or grinding after the conductive patterns have been separated into pieces, thereby producing a semiconductor package of given thickness.

In a case where a plurality of units are fabricated on the board member 50, each unit to act as a semiconductor device 73, the units are separated into individual semiconductor devices 60 in a process subsequent to the separation process.

Figure 3A:
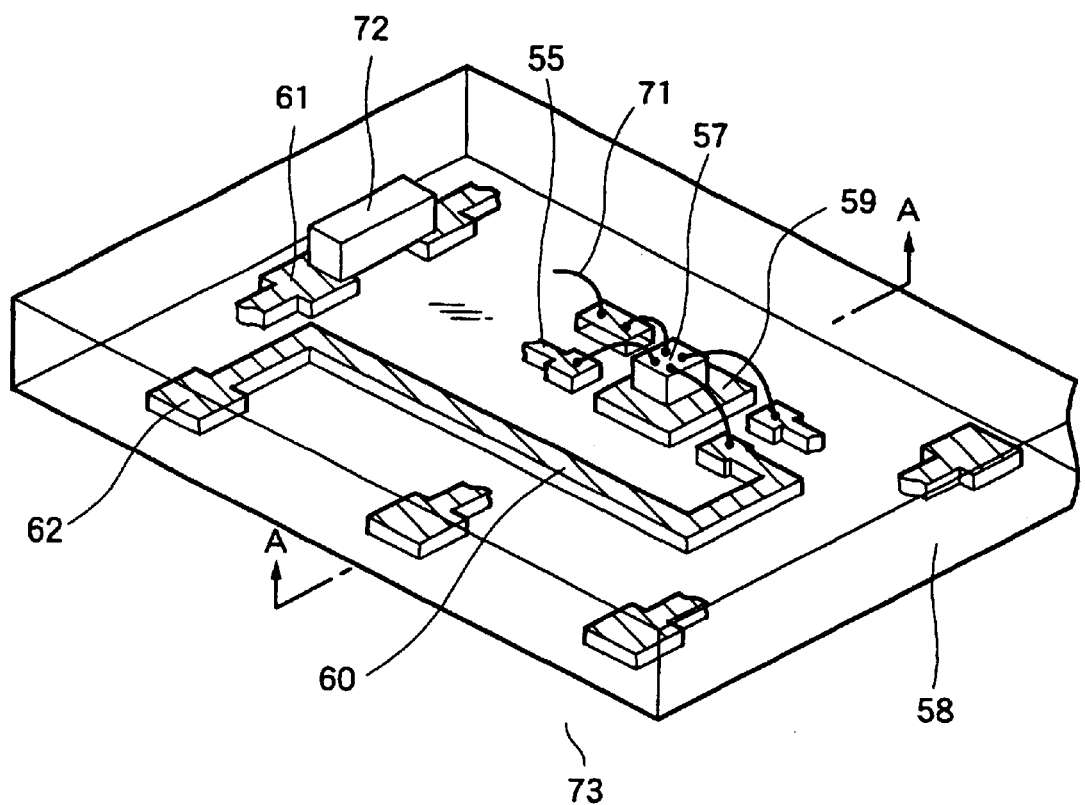
FIGS. 3A and 3B are illustrations for describing a method of manufacturing a semiconductor device which employs the sheet-like board member according to the present invention.
Figure 3B:
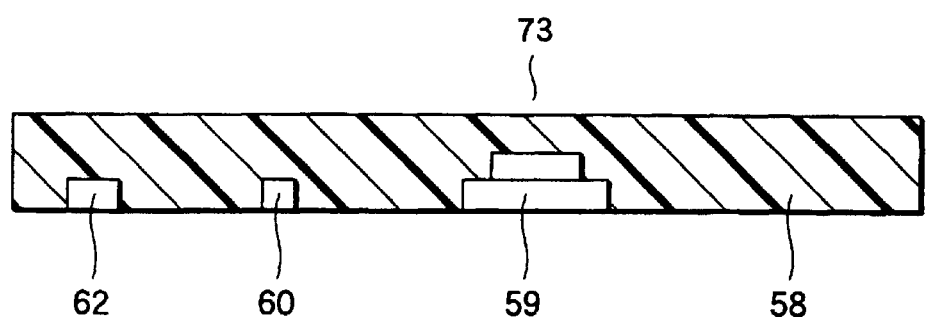

Although the units are separated into pieces by means of adoption of a dicing machine, the units can be separated by means of breaking perforations, pressing, or cutting (see FIGS. 3A and 3B with regard to the description thus far).

The foregoing manufacturing method enables realization of a smaller and lower-profile semiconductor package through use of three elements; the plurality of conductive patterns, the semiconductor element 57, and the insulting plastic 58.

Advantages yielded by the manufacturing method will now be described.

First, the conductive patterns are subjected to half etching and are integrally formed with the sheet-like board member 50. Therefore, there can be obviated a board which has been employed as a support board in the background art.

Second, the board member 50 is subjected to half etching, thereby producing conductive patterns in the form of protuberances and thereby enabling formation of fine conductive patterns. Accordingly, the widths of conductive patterns and a pitch between conductive patterns can be made smaller, thereby enabling formation of a semiconductor package having a smaller in-plane size.

Third, since a semiconductor package is formed from the foregoing three elements, the semiconductor package can be formed from the required minimum number of elements, thus reducing needless material to a minimum. Accordingly, there can be embodied a low-profile semiconductor device 73 whose costs are minimized.

Fourth, the die pad 59, the wiring 60, and the pads 55 and 61 are formed in the form of protuberances through half etching, and are separated into pieces after encapsulation of the board member 50. Therefore, use of a tie bar and suspension leads is obviated. Accordingly, the present invention completely eliminates a necessity for forming and cutting a tie bar (and suspension leads).

Fifth, after the conductive patterns formed in the form of protuberances have been encapsulated in insulating plastic, a sheet-like board member is removed from the underside of the insulating plastic, and leads are separated into pieces. In contrast with the case of a semiconductor package using a known lead frame, no plastic burrs arise between leads.

Sixth, the underside of a semiconductor element becomes exposed through the back of the insulating plastic 58, and hence the heat developing in the semiconductor device 73 can be efficiently dissipated from the back of the semiconductor device 73.

Figure 4:
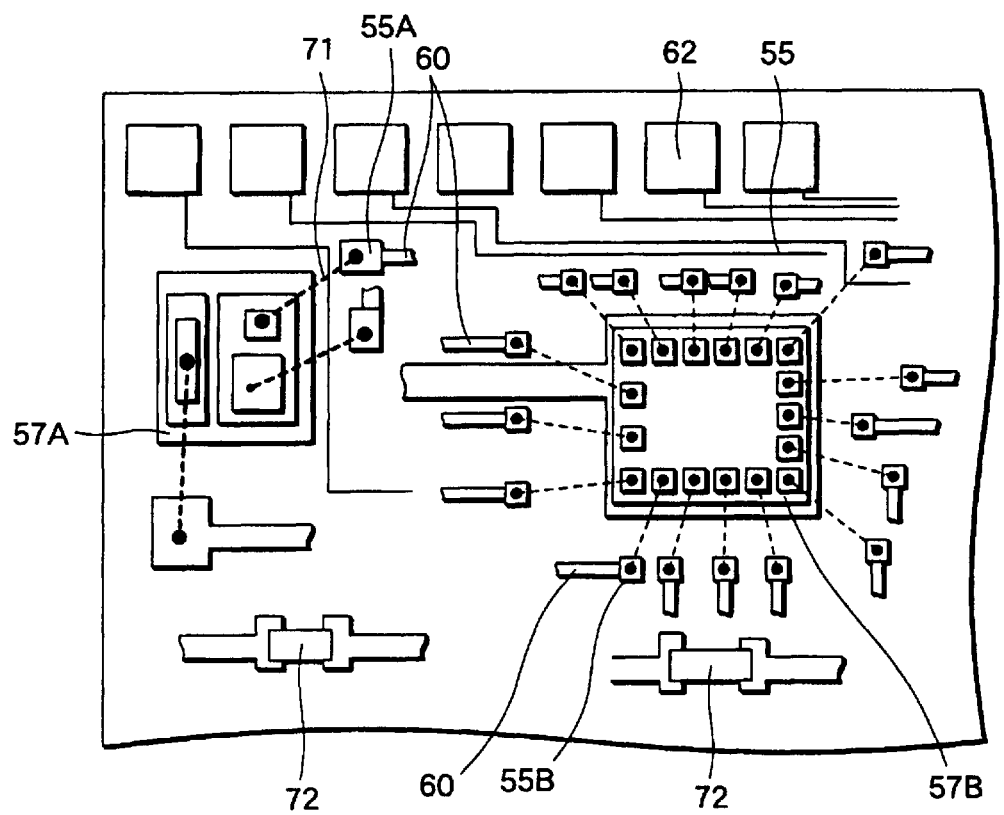
FIG. 4 is a schematic representation for describing a conductive pattern of a sheet-like board member according to the present invention.

FIG. 4 is a fragmentary plan view for describing example conductive patterns. A hybrid IC is provided with bonding wires or lines for causing active and passive elements to act as IC circuits.

A plurality of transistors 57A and IC elements 57B are formed as semiconductor elements, and the passive elements 72 are formed, as required. Bonding pads 55A and 55B are formed around respective semiconductor elements for electrical connection purposes. Wirings 55 are formed in various manners. For instance, a wiring 60 formed integrally with the first bonding pad 55B is routed along a desired circuit pattern from one end of a semiconductor device to the other end thereof or so as to make a detour to avoid a land 57.

Thus, various types of wirings, such a short line, a long wiring, a thick wiring for power supply, and a narrow, lengthy wiring for signal input/output purposes, may be employed as the wiring 55. In contrast with the case of a lead frame, such a wiring is integrally formed with a board member and is separated after encapsulation of the board member. Therefore, the wiring is not susceptible to deformation, such as warpage. Further, the side surfaces of conductive patterns can be formed so as to assume a curved structure, or an anvil-shaped structure can be formed from a conductive coating film provided on a conductive pattern. As a result, exfoliation of wirings from insulating plastic can be prevented.

Fourth Embodiment for Describing a Sheet-Like Board Member

Figure 5A:
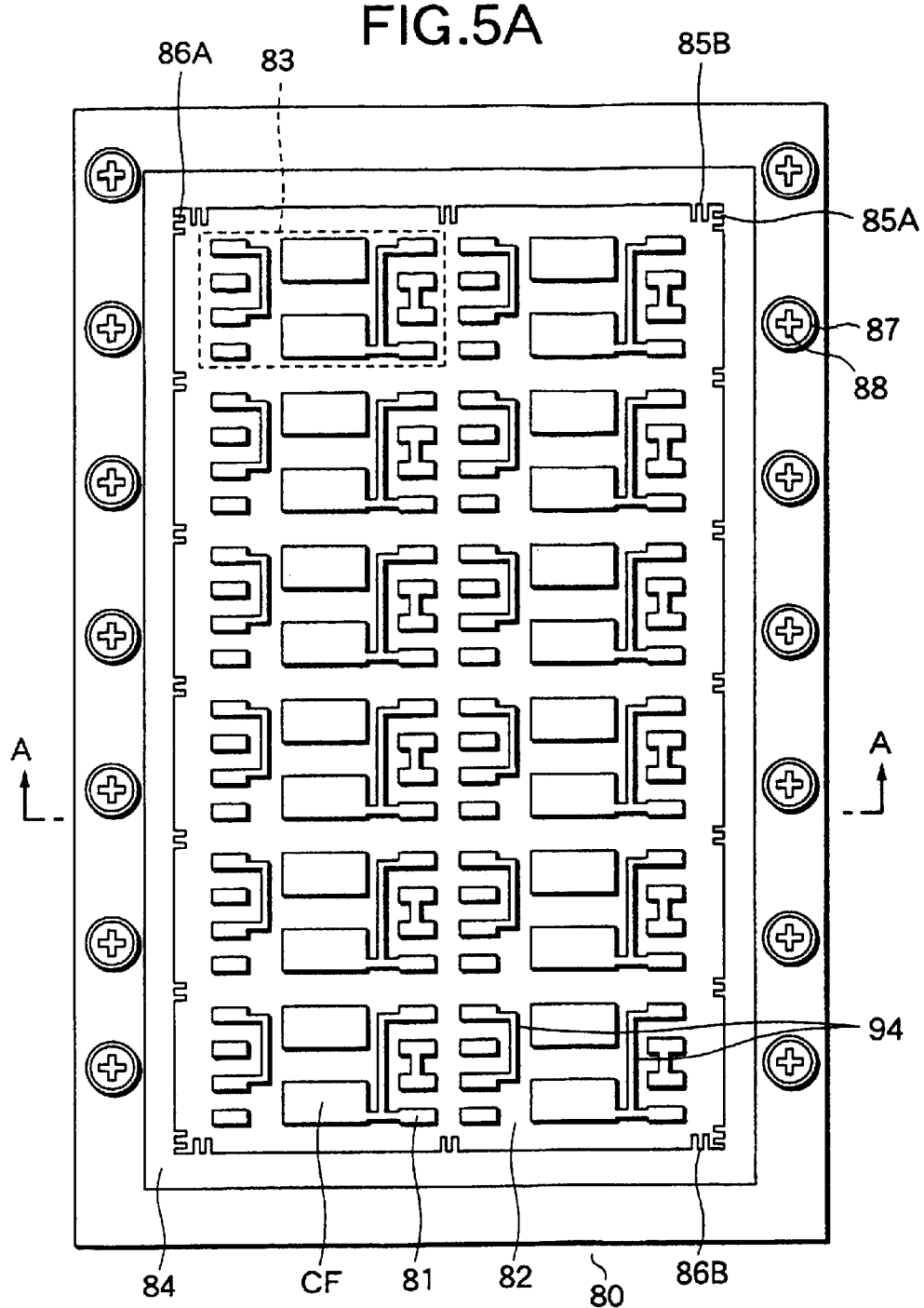
FIGS. 5A and 5B are illustrations for describing a sheet-like board member according to the present invention.
Figure 5B:
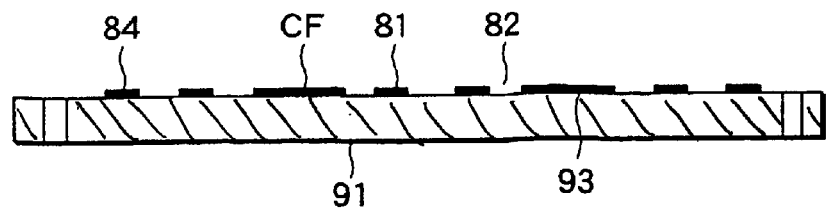

FIGS. 5A and 5B show a sheet-like board member 80 which is formed from a conductive coating film CF in the same manner as are the sheet-like board members described in connection with the first embodiment. A photoresist film may be formed in lieu of the conductive coating film CF. In this case, a conductive coating film is formed in each of areas which are located below a photoresist film and correspond to bonding pads. The geometry of the sheet-like board member 80 will be described in detail in connection with FIG. 12, and hence only the outline of the sheet-like board member 80 will be described here.

The lead frame pattern shown in FIGS. 5A and 5B corresponds to a specific embodiment of the lead frame pattern shown in FIG. 1. More specifically, a plurality of pattern units 83, one of which is enclosed by broken lines and each of which constitutes a single semiconductor device, are formed into a matrix pattern. A metal mold abutting region 84 is formed in a ring shape and to a predetermined width so as to enclose the matrix pattern. Thus, FIG. 5A shows a lead frame pattern formed within a single cavity.

Register marks 85 and 86 are formed at positions located inward of the mold abutting region 84. An imaginary line interconnecting a register mark 85A and a register mark 86A indicates a lateral dicing line, and an imaginary line interconnecting a register mark 85B and a register mark 86B indicates a longitudinal dicing line. Each of the register marks 85A is printed in the form of at least one short straight line. The orientation of a blade of a dicing machine is aligned with reference to the shortline 85A. In the present embodiment, the register mark 85A is formed from two lines which are spaced a desired interval (margin) from each other, such that the blade can dice with a desired accuracy.

First patterns 87 and second patterns 88 are formed outside the metal mold abutting region 84 for forming guide holes. A cross sign of the second pattern 88 is a centering mark to be used for drilling a guide hole. Alternatively, guide holes—which are identical in shape with the first pattern—are formed in a pattern beforehand, without involving formation of the pattern.

The sheet-like member 80 is identical with that described in connection with the first embodiment, with the exception of the dicing line marks and the metal mold abutting region 84. Hence, explanation of the characteristics and advantages of the present embodiment is omitted.

Fifth Embodiment for Describing a Sheet-Like Board Member

Figure 6A:
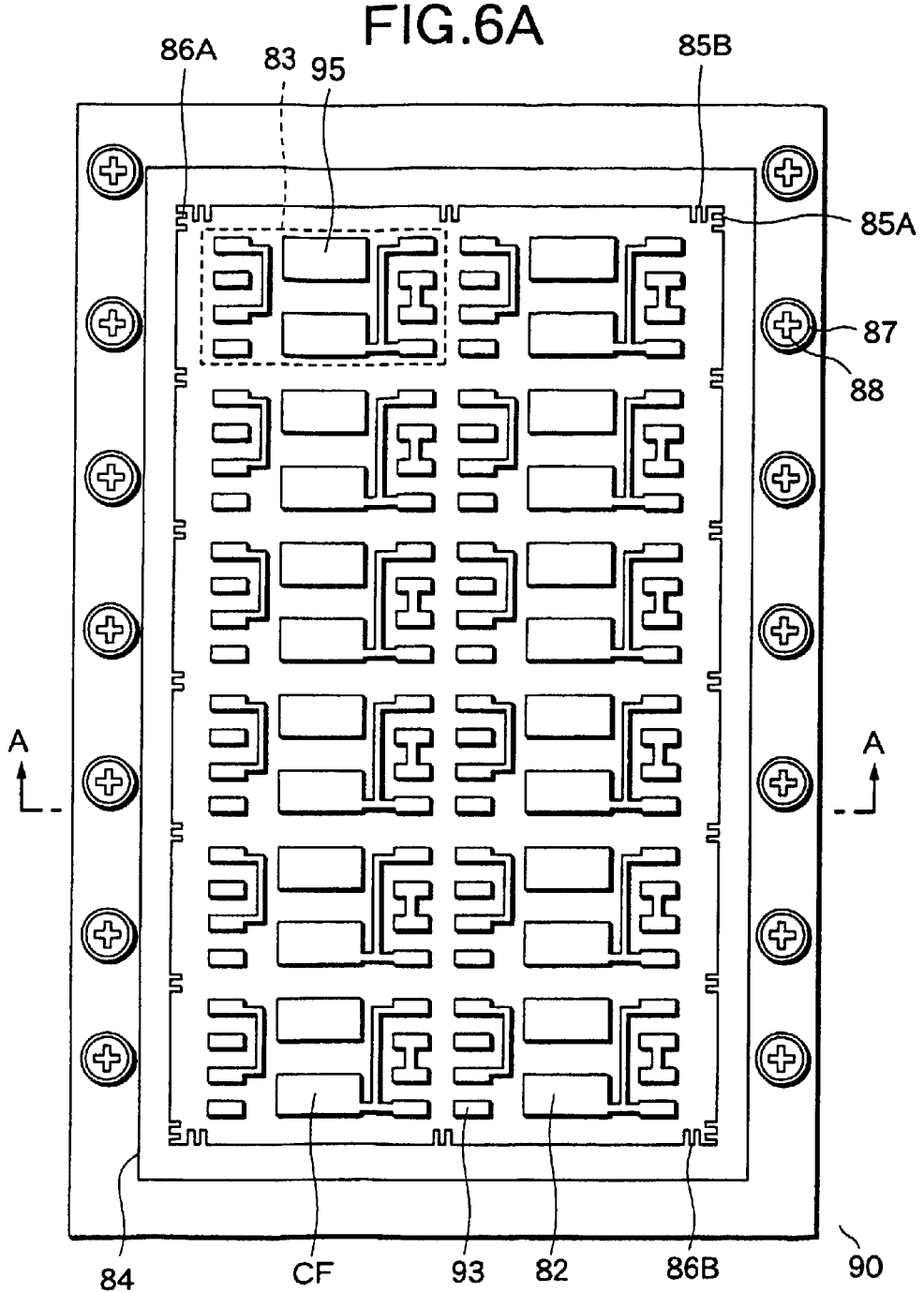
FIGS. 6A and 6B are illustrations for describing a sheet-like board member according to the present invention.
Figure 6B:
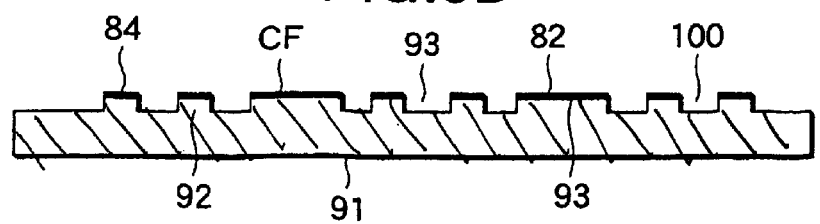

A sheet-like board member 90 according to a fifth embodiment of the present invention assumes a pattern shown in FIGS. 6A and 6B. The sheet-like board member 90 is subjected to half etching by using the conductive coating film CF or photoresist film described in connection with the fourth embodiment.

More specifically, in place of a known lead frame, the sheet-like board member 90 is used for, for example, SIP, DIP, or QIP. The sheet-like board member 90 is subjected to half etching, except for conductive patterns and the metal abutting region 84. In the present embodiment, there is no necessity of forming a die pad, and a die pad may be obviated in consideration of heat dissipation characteristics. Further, first and second register marks 87 and 88 may be formed into protuberances by means of half etching.

The sheet-like board member 90 comprises a first planar surface 91 and a second surface 93 which is provided opposite the first surface 91 and on which one or more protuberances 92 are formed to desired heights.

The protuberance 92 constitutes a semiconductor element mount region 95, or the protuberances 92 constitute first pads 93 provided in proximity to the semiconductor element mount region 95.

In the sheet-like board member 90, respective patterns are in a half-etched state. In an unmodified form of the sheet-like board member 90, a semiconductor element can be mounted, electrically connected, and encapsulated. Thus, the present embodiment has a characteristic of providing the ability to manufacture a semiconductor package in a post-processing process through use of an existing apparatus.

Since the advantages of the present embodiment have already been described in connection with the first and fourth embodiments, repeated explanation is omitted here.

Sixth Embodiment for Describing a Method of Manufacturing a Semiconductor Device A method will be described by reference to FIGS. 5A through 12D.

As shown in FIGS. 5A and 5B, the sheet-like board member 80 is prepared. The material of the sheet-like board member 80 is determined in consideration of the adhesive properties of brazing material, bonding properties, and plating properties. More specifically, a conductive foil primarily made of Cu, a conductive foil primarily made of Al, or a sheet-like conductive foil made of a alloy such as Fe—Ni alloy is employed as the material of the sheet-like board member 80. Alternatively, the board member may be made of a Cu—Al multilayered member or a Cu—Al—Cu multilayered member. On the surface of the sheet-like board member 80, there are formed, from a conductive coating film or a photoresist film, the first die pad 93, the die pad 82, the wiring 94, the metal abutting region 84, the register marks 85 and 86, and conductive patterns 87 and 88.

In consideration of an etching operation to be effected in a subsequent process, a preferable thickness of a conductive foil is 10 µm to 300 µm or thereabouts. In the present embodiment, a copper foil of 70 µm thickness (or two ounces) is adopted. However, in principle there may be employed any material having a thickness below or above the range of thickness from 10 µm to 300 µm (see FIGS. 5A and 5B with regard to the description thus far).

Subsequently, the method comprises a step of etching the sheet-like board member 80, exclusive of at least areas of the board member 90 which are to become the first die pad 93, the die pad 82, the wiring 94, the metal mold abutting region 84, the register marks 85 and 86, and the patterns 87 and 88.

Here, the conductive coating film CF or photoresist film is used as an etching-resistant mask, and isolation trenches 100 are formed shallower than the thickness of the sheet-like board member 90 by etching through the mask as shown in FIG. 6.

According to the present method, the sheet-like board member 80 is non-anisotropically etched by means of wet or dry etching, and the thus-edged sheet-like board member 90 is characterized by side surfaces that are curved and rough.

In the case of a wet etching, ferric chloride or cupric chloride is usually adopted as an etchant. The conductive foil is dipped in the etchant, or the etchant is showered on the conductive foil.

Etching encounters difficulty in proceeding in a horizontal direction particularly at a position immediately below the conductive coating film CF which is to act as an etching mask. As a result, an area deeper than the conductive coating film CF is etched horizontally. For this reason, the cross section of the isolation trench 100 resembles an anvil. More specifically, the width of the top of the isolation trench 100 becomes smaller than the width of the same at a certain depth. In other words, the isolation trench 100 assumes an anchor structure. By means of adoption of a showering method, etching proceeds in a depthwise direction, and horizontal etching is retarded. Thus, an anchor structure becomes noticeable.

In the case of dry etching, the sheet-like board member 90 can be etched anisotropically or non-anisotropically. Although removal of Cu through reactive ion etching (RIE) has been said to be impossible, Cu can be removed by means of sputtering. Depending on conditions for sputtering, the sheet-like board member 90 can be etched anisotropically or non-anisotropically.

Materials considered for adoption as a conductive coating film include Ag, Au, Pt, Ni or Pd. These corrosion-resistant conductive coating films have a characteristic of being unable in unmodified form as die pads or bonding pads.

For example, an Ag coating film is bonded to Au or a brazing material. Therefore, so long as the underside of a semiconductor chip is coated with an Au coating film, the semiconductor chip can be mounted directly on an Ag coating film covering the die pad 82, through thermocompression bonding. Alternatively, the semiconductor chip can be mounted on the die pad 82 by using a brazing material such as solder. Since an Au bonding wire can be bonded to a conductive Ag coating film, a semiconductor chip can be mounted on the die pad 82 by means of wire bonding. Thus, the present method has a merit of providing the ability to utilize the conductive coating film in an unmodified form as a die pad or bonding pads (see FIGS. 6A and 6B with regard to the description thus far).

Figure 7A:
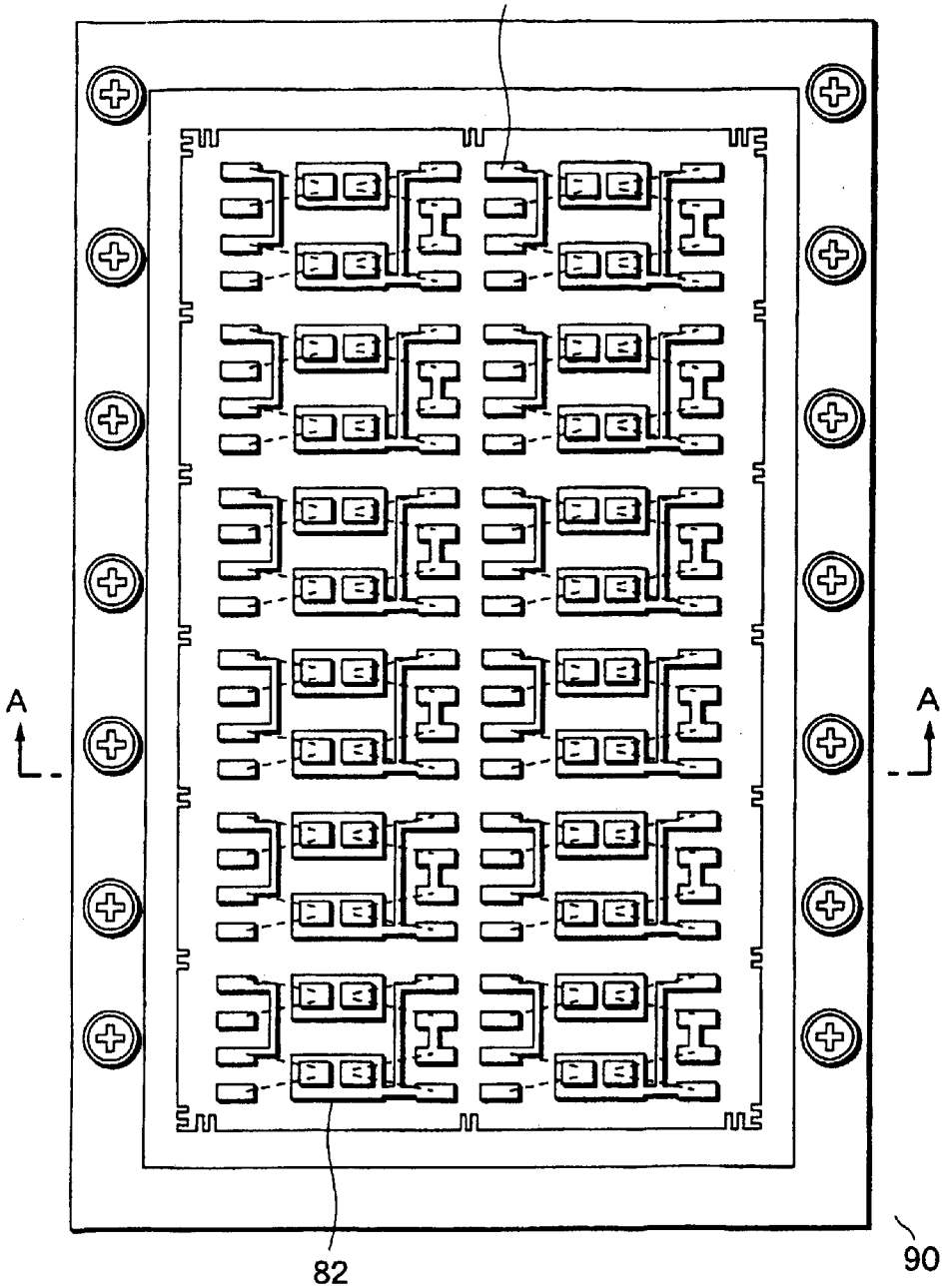
FIGS. 7A and 7B are illustrations for describing a method of manufacturing a semiconductor device employing a sheet-like board member according to the present invention.
Figure 7B:
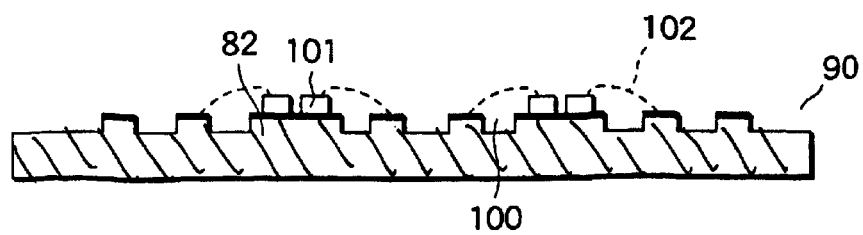

As shown in FIGS. 7A and 7B, there is carried out a process of mounting a semiconductor element 101 on the die pad 82 in which the isolation trenches 100 are formed.

The semiconductor element 101 corresponds to a transistor, a diode, an IC chip, or the like. Further, an SMD (including a face-down semiconductor element), such as a CSP or BGA of wafer-scale type, and Flip-chip can also be mounted. However, in this case, a resultant semiconductor package assumes a large thickness.

In the present embodiment, a bare transistor 101 is die-bonded to each of the die pads 82. Bonding pads provided on the transistor 101 are connected to first pads 93 by using bonding wires 102, by means of ball bonding using thermocompression bonding, or by means of wedge bonding using ultrasonic waves.

Since the first pads 93 of very small size are integrally formed with the sheet-like board member 90, the first pads 93 can transmit the energy imparted by a bonding tool, so that the bonding characteristic of the first pads 93 is improved. In some cases, the bonding wires 102 are subjected to pull-cutting after bonding. At this time, since the first pads 93 are integral with the board member 90, floating of bonding pads can be prevented, and hence the ease of pull-cutting of bonding wires can be improved (see FIGS. 7A and 7B with regard to the description thus far).

Figure 8A:
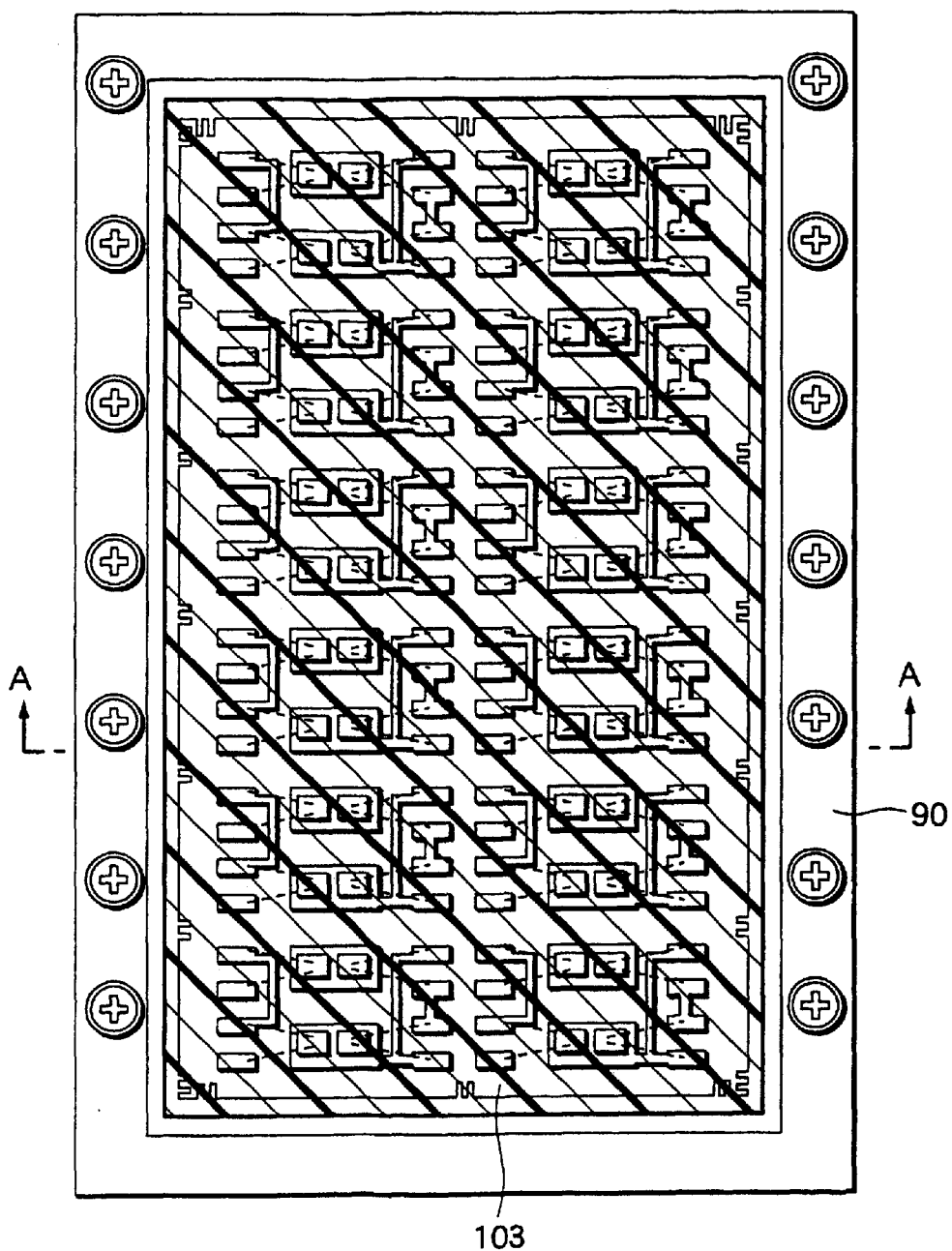
FIGS. 8A and 8B are illustrations for describing a method of manufacturing a semiconductor device employing a sheet-like board member according to the present invention.
Figure 8B:
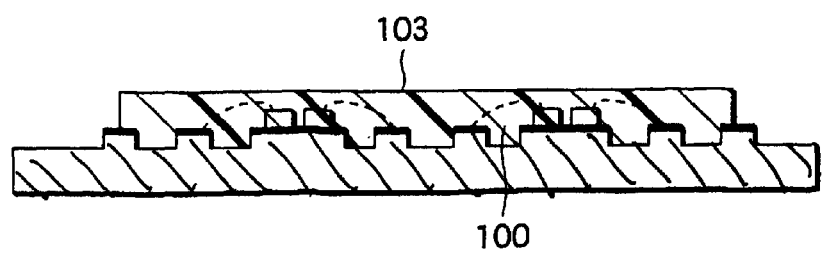

As shown in FIGS. 8A and 8B, there is carried out a process of applying insulating plastic 103 to the isolation trenches 100 having curved side surfaces, by means of transfer molding, injection molding, dipping, or coating. Thermosetting resin, such as epoxy resin, can be used as plastic material for transfer molding purpose. Thermoplastic resin, such as liquid-crystal polymer, polyphenylene sulfide, or the like, can be used as plastic material for injection molding purpose.

In the present embodiment, the insulating plastic is controlled so as to be built up to a thickness of about 100 μm from the top of the bonding wires 102. The thickness of the insulating plastic can be increased or decreased in consideration of strength of a semiconductor device.

The present process is characterized in that the sheet-like board member 90 acts as a support board until the isolation trenches 100 are filled with the insulating plastic 103 and the insulating plastic 103 cures. A support board, such as a glass epoxy board, a flexible sheet, or a ceramic board, has conventionally been required. However, the present invention can obviate such a support board.

Since the isolation trenches 100 having a curved structure are filled with the insulating plastic 103, the thus-filled portion of the isolation trenches 100 provides an anchoring effect, thereby preventing exfoliation of conductive patterns from the insulating plastic 103.

Before the isolation trenches 100 are coated with the insulating plastic 103, silicon resin or the like may be potted in order to protect a semiconductor chip or connected portions of bonding wires.

Figure 9A:
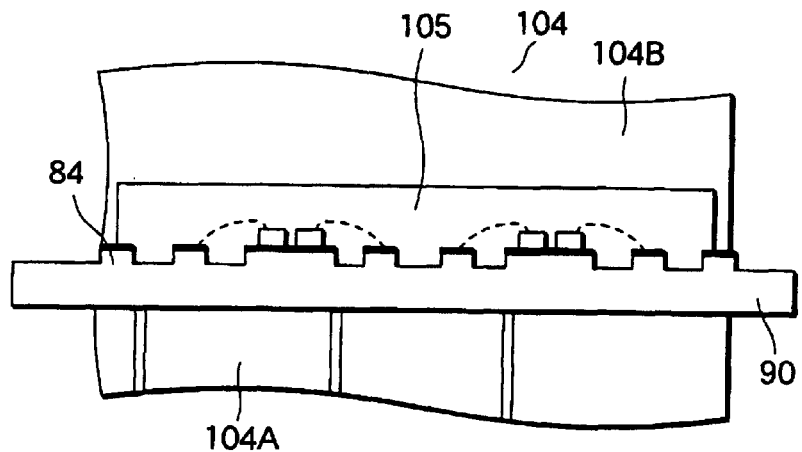
FIGS. 9A through 9C are illustrations for describing a method of manufacturing a semiconductor device employing a sheet-like board member according to the present invention.
Figure 9B:
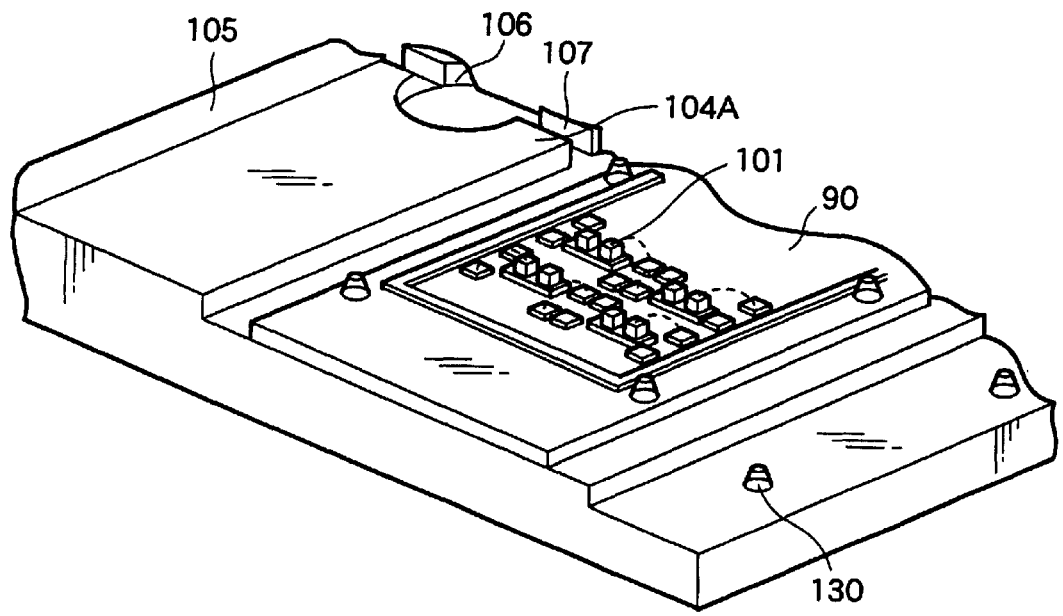
Figure 9C:
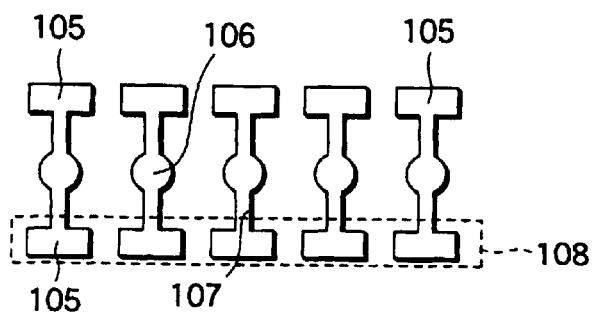

FIGS. 9A through 9C illustrate a molding method. FIG. 9A is a cross-sectional view showing plastic charged into the cavity 105 defined within the metal mold 104. The entire underside of the sheet-like board member 90 is found to remain in contact with a lower metal mold 104A, and an upper metal mold 104B is found to be in contact with the mold abutting region 84 of the sheet-like board member 90. Reference symbol V designates a vacuum suction hole. FIG. 9B designates the lower metal mold 104A on which the sheet-like board member 90 is fixed. Reference numeral 105 designates guide pins 130 provided on the lower metal mold 104A. The guide pins 130 jut from the guide holes formed in the sheet-like board member 90.

Figure 11:
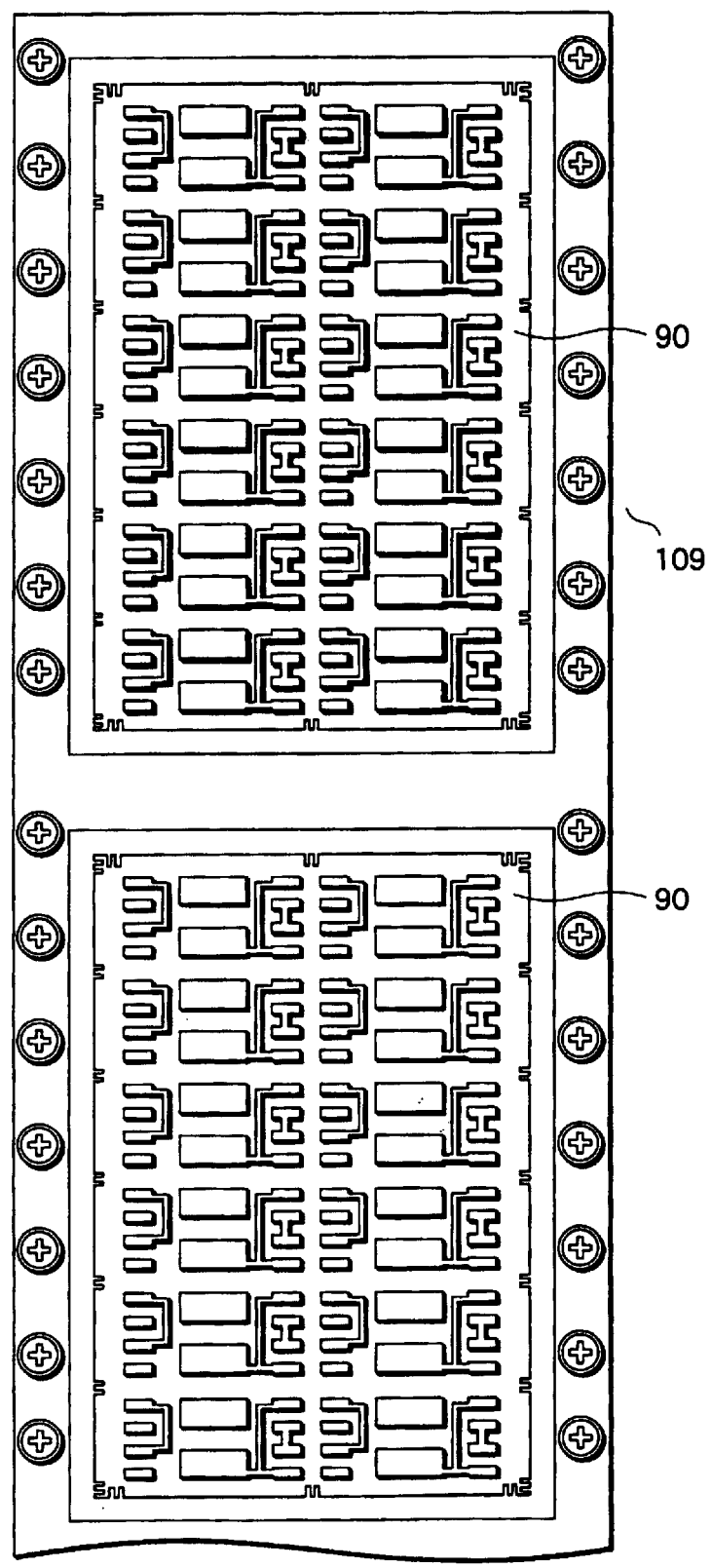
FIG. 11 is an illustration for describing a semiconductor device employing a sheet-like board member according to the present invention.

FIG. 9C is an explanatory view for describing the relationship between the cavity 105 defined within the metal mold 104, a runner 107, and a pot 106. As shown in the drawing, a plurality of cavities 105 are arranged in a horizontal direction, and the sheet-like board member 90 is designed so as to produce a plurality of semiconductor devices from a single lead frame. Reference numeral 108 indicated by broken lines designates an area in which a sheet-like board member is to be arranged (hereinafter referred to simply as a "sheet-like board member arrangement area"). For example, a sheet-like board member 90 shown in FIG. 11 is placed in the sheet-like board member arrangement area 108 in the same manner as is a known lead frame. The sheet-like board member 109 corresponds to integration of a plurality of sheet-like board members 90 shown in FIGS. 6A and 6B. A semiconductor device manufactured from such a sheet-like board member 90 is compact. Further, a plurality of sheet-like board members can be produced within a single cavity. Thus, semiconductor devices can be mass-produced, thereby resulting in reduction of manufacturing costs (see FIGS. 8A through 9C with regard to the description thus far).

In a subsequent step, the encapsulated sheet-like board member 90 is taken out of the metal mold 104, and a portion of the sheet-like board member 90 exposed through the underside of the insulating plastic 103 is removed. The first pad 93 and conductive patterns, such as die pads, are then separated.

Figure 10A:
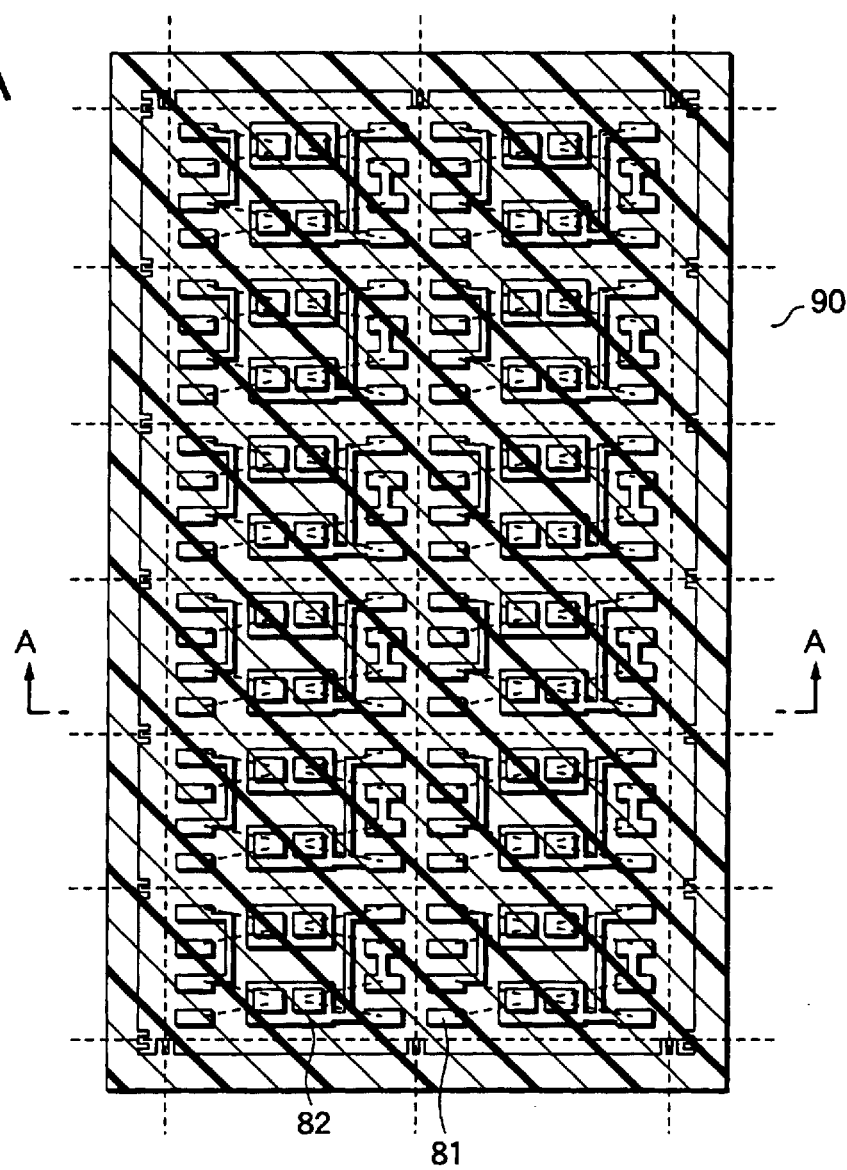
FIGS. 10A through 10C are illustrations for describing a method of manufacturing a semiconductor device employing a sheet-like board member according to the present invention.
Figure 10B:
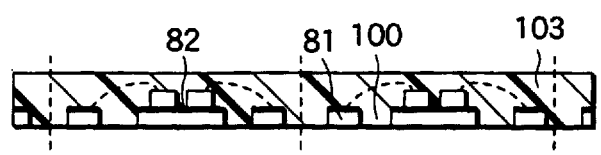

FIG. 10A is a plan view showing separation lines, and FIG. 10B shows that the underside of the insulating plastic 103 is on the same level with the undersides of the first pads 93, or that the underside of the insulating plastic 103 is on the same level with the undersides of the die pads 81 and 82. The underside of the insulating plastic 103 can be removed by means of an abrading device until the isolation trenches 100 are exposed. Here, it may be the case that an insulating coating film, such as a solder resist, may be formed on the underside of the insulting region 103, and that only the portions of the underside which must be electrically connected are exposed.

Figure 10C:
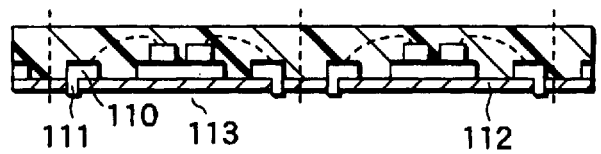

FIG. 10C shows the first die pads 81 when abrasion of the first dies pads 81 is stopped at an intermediate position, as a result of which a protuberance 111 is formed on the other end 110 of each of the first die pads 81. More specifically, the protuberances 111 can be formed, by means of forming a photoresist film in an area of each of the first die pads 61 which is to become a protuberance 111, and etching the underside of the insulating plastic 103 other than the areas covered with the photoresist films. An insulating coating film 112 is formed on the underside of the insulating plastic 103 such that the protuberances 111 become exposed, thereby preventing occurrence of an electrical short circuit between a conductor provided on a board and the first die pads 81 located above the conductor. In a case where a semiconductor chip is mounted on by means of brazing material, there can be prevented contact between adjacent first die pads 81 or the die pad 82, which would otherwise be caused by spreading of solder melt to the first die pad 81. Particularly, the insulating coating film 112 becomes more effective as conductive patterns become narrower.

Finally, the thus-molded sheet-like board member 90 is placed on a dicing table, and the position of a blade is adjusted with reference to the register marks 85 and 86. The sheet-like board member 90 is diced along the lines indicated by broken lines, thereby completing formation of semiconductor devices 113.

According to the present method, a transistor is mounted on the island 82. A diode or an IC may be mounted in place of the transistor. Further, a plurality of semiconductor chips may be mounted on a single island 82. Depending on the structure of a sheet-like board member, a plurality of semiconductor chips may be mounted on a single island, or there may be provided a plurality of islands such that semiconductor chips can be mounted on the respective islands.

A semiconductor device employed in the present embodiment will be described in more detail by reference to FIGS. 12A through 12C.

In the semiconductor device, wirings L1 and L2 are formed as a conductive pattern 151. Land-like electrodes 151B, 151C, 151E through 151J are formed as first pads and/or outer lead electrodes. Further, electrodes 151A and 151D are formed as die pads.

IC circuits range from a large-scale circuit to a small-scale circuit. Because of limitations imposed on a drawing, FIG. 12A shows a small-scale circuit. This circuit is embodied by means of connecting a differential-amplifying circuit frequently used in an audio amplifying circuit to a current-mirror circuit. As shown in FIG. 12A, the differential amplifying circuit consists of transistors TR1 and TR2. The current-mirror circuit is primarily made up of transistors TR3 and TR4.

Figure 12A:
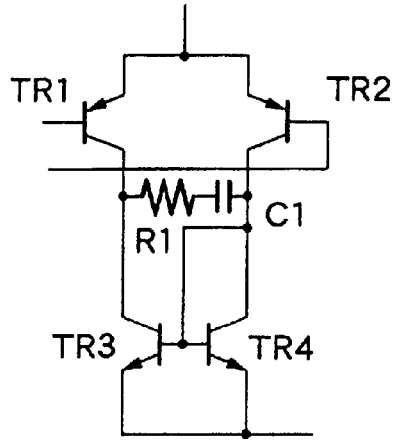
FIGS. 12A through 12D are illustrations for describing a semiconductor device employing a sheet-like board member according to the present invention.
Figure 12B:
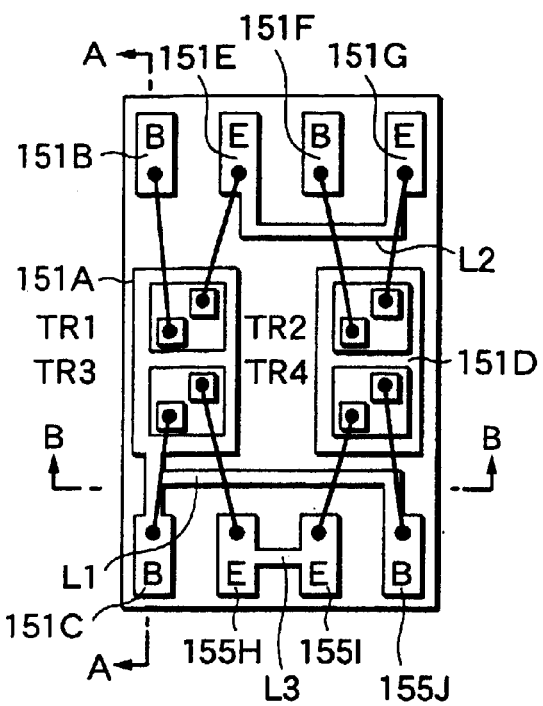
Figure 12C:
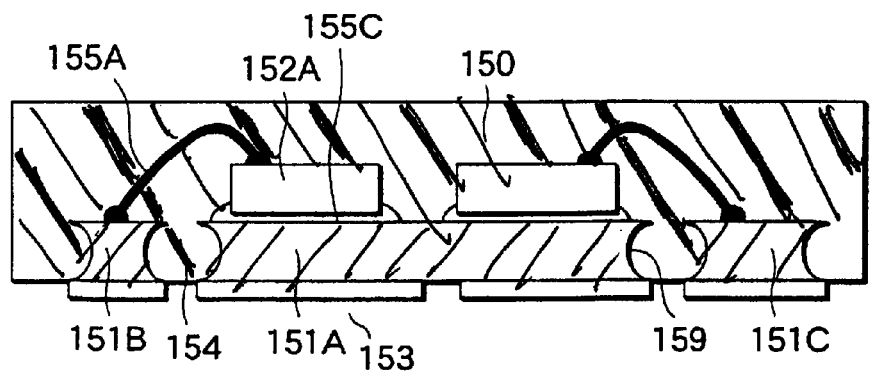
Figure 12D:
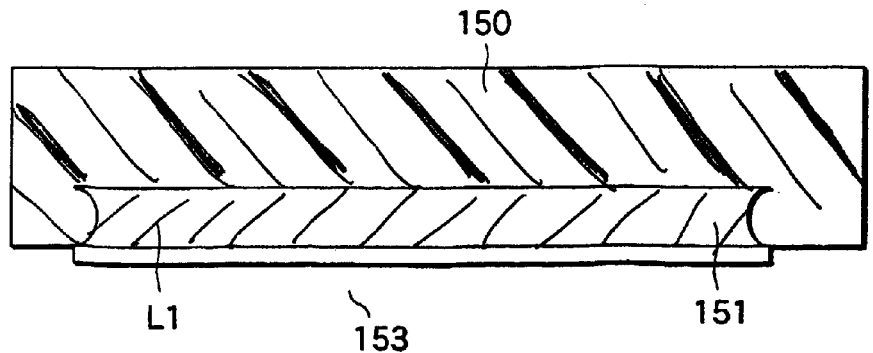

FIG. 12B is a plan view of a semiconductor device on which the circuit shown in FIG. 12A is embodied. FIG. 12C is a cross-sectional view taken along line A-A shown in FIG. 12B, and FIG. 12D is a cross-sectional view taken along line B-B. A die pad 151A on which the transistors TR1 and TR3 are to be mounted is provided on the left side, and a die pad 151D on which the transistors TR2 and TR4 are to be mounted is provided on the right side. An electrode 151B and electrodes 151E through 151G, all beings for external connection purposes, are provided above the die pads 151A and 151D. An electrode 151C and electrodes 151H through 151J are provided below the die pads 151A and 151D. The emitter of the transistor TR3 and the emitter of the transistor TR2 are commonly connected, and hence the wiring L2 is integrally formed with the electrodes 151E and 151G. Further, the base of the transistor TR3 and the base of the transistor TR4 are commonly connected, and the emitter of the transistor TR3 and the emitter of the transistor TR4 are commonly connected. Therefore, the wiring L1 is integrally formed with the electrode 151C and an electrode 155J. Further, the wiring L3 is integrally formed with electrodes 155H and 155I.

The present invention is characterized by the wirings L1 through L3. In FIG. 4, a wiring 60 corresponds to the wirings L1 through L3. The width of the wiring varies in accordance with the degree of integration of a hybrid IC. Specifically, the width of the wiring is as narrow as 25 µm or more. The wiring assumes a width of 25 µm when formed by means of wet etching. The width of the wiring can be made narrower when the wiring is formed by means of dry etching.

As is evident from FIG. 12D, only the underside of the wiring L1 is exposed, and the other sides of the wiring L1 are enclosed by insulating plastic 150. In other words, the wiring L1 is embedded in the insulating plastic 150, thereby preventing exfoliation or warpage of a wiring. Particularly, since a conductive path has a rough and curved structure, which structure in turn constitutes an anvil-shaped structure in the vicinity of surface of the conductive path. As a result, the conductive path produces an anchoring effect, which prevents exfoliation of the conductive path from insulating plastic.

As mentioned previously, the electrodes for external connection 151B, 151C, and 151E through 151J are embedded in insulating plastic. Even if force is applied to an electrode from an external lead to be connected to the electrode, the electrode is prevented from being exfoliated.

Next will be described a semiconductor device in which a simple circuit is constituted of a plurality of transistors, by reference to FIGS. 13 through 16. The outermost rectangular line denotes the outer edge of a semiconductor device.

Figure 13:
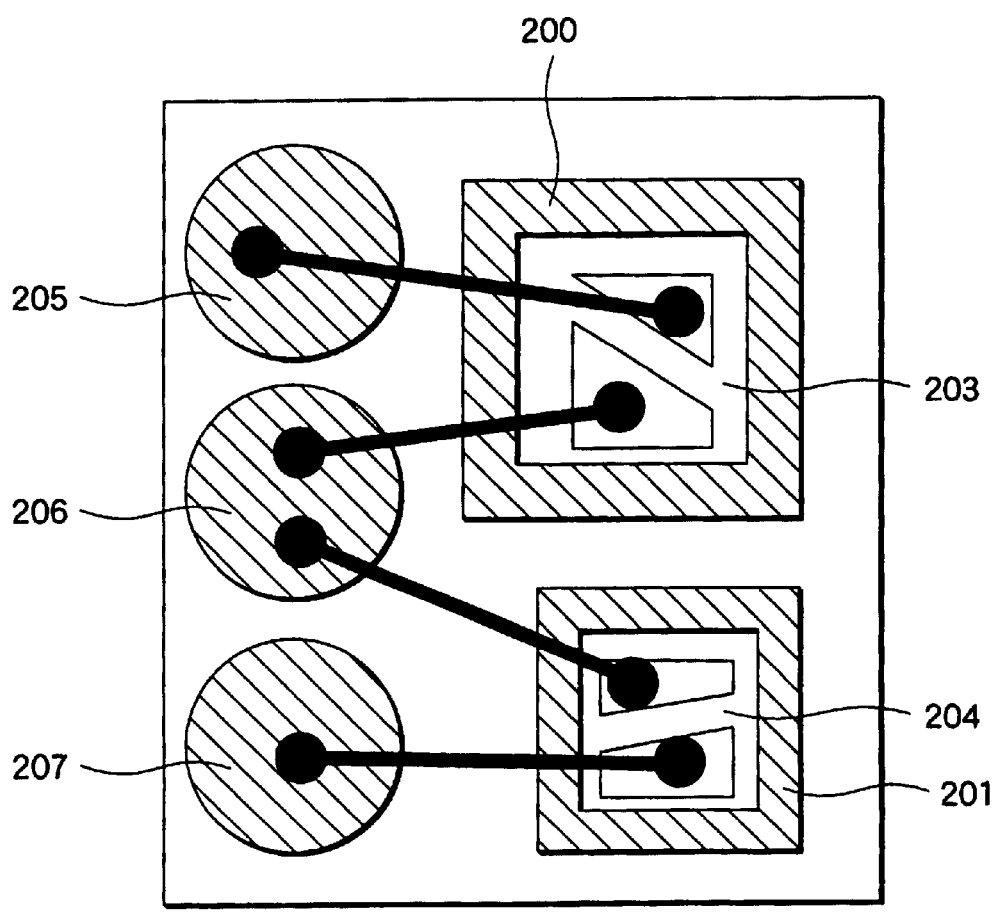
FIG. 13 is a schematic representation for describing a sheet-like board member according to the present invention.

In a semiconductor device shown in FIG. 13, a semiconductor element 203 is mounted on a die pad 200, and a semiconductor element 204 is mounted on a die pad 201. Bonding wires are connected to respective electrodes 205 through 207 which act as first pads and outer lead electrodes. The electrode 206 is provided for maintaining to wirings at the same electric potential. Electric wirings provided for interconnecting the electrodes 205 through 207 are omitted. The electrode 206 acts as a wiring for maintaining at the same electric potential bonding pads, outer lead electrodes, and two electrodes.

Figure 14:
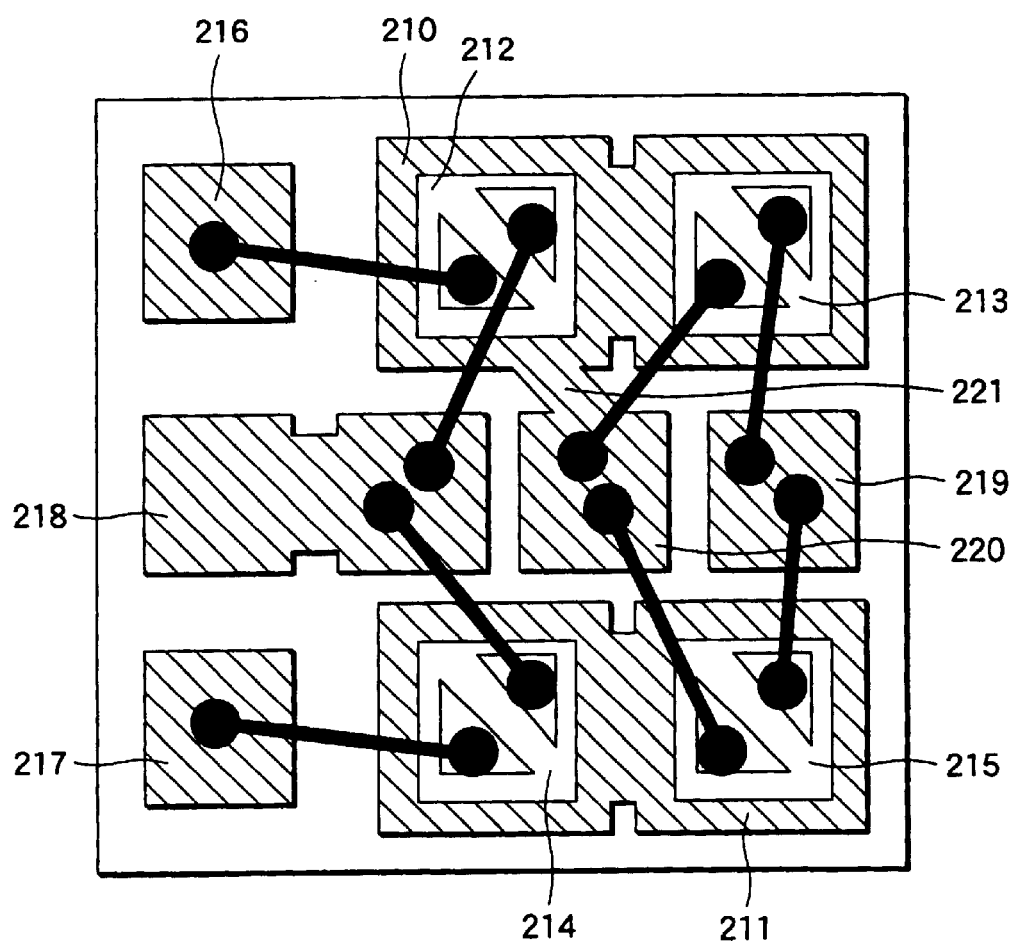
FIG. 14 is a schematic representation for describing a sheet-like board member according to the present invention.

In a semiconductor device shown in FIG. 14, semiconductor elements 212 and 213 are mounted on a die pad 210, and bonding wires are connected to first pads 215 through 220. Further, the first pad 220 is integrally formed with the die pad 210, and a wiring 221 is provided for interconnecting the die pad 210 and the first pad 220. In contrast with the case of the semiconductor device shown in FIG. 13, bonding pads are formed so as to be scattered over the semiconductor device.

Figure 15:
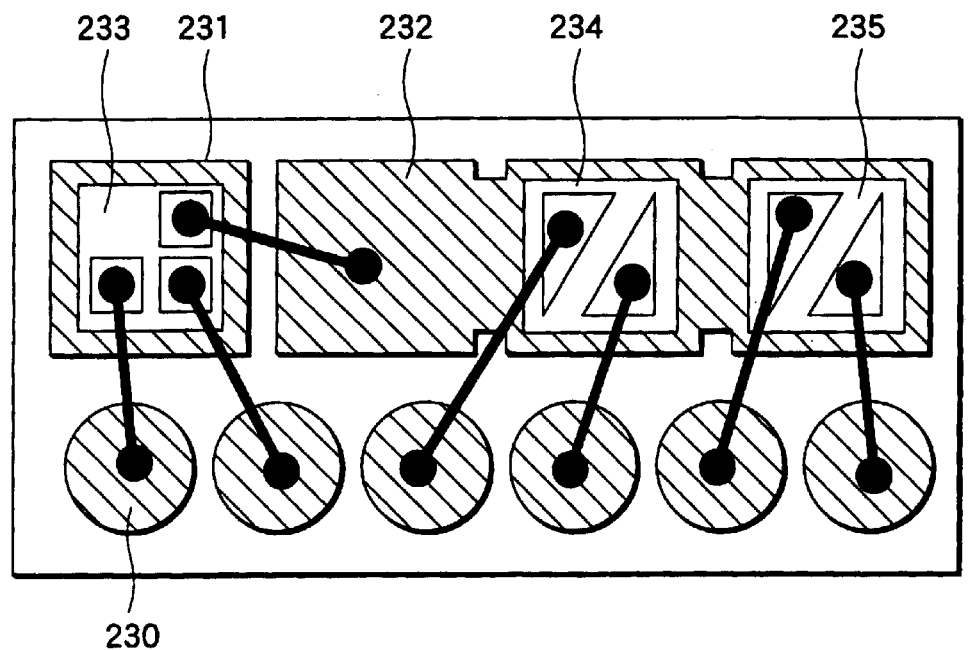
FIG. 15 is a schematic representation for describing a sheet-like board member according to the present invention

In a semiconductor device shown in FIG. 15, first pads 230 are formed into a row along one side of the semiconductor device. Further, a semiconductor element 233 is bonded to a die pad 231, and semiconductor elements 233 to 235 are mounted on a die pad 232. The die pad 232 acts as a land on which a semiconductor element is mounted and as a bonding pad.

Figure 16:
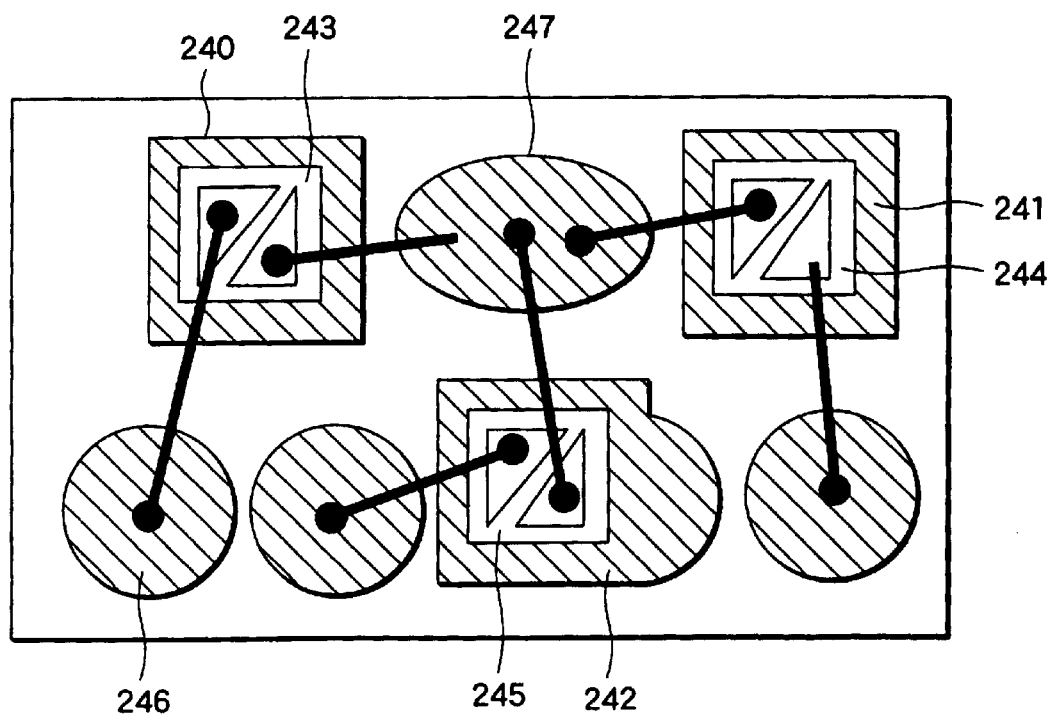
FIG. 16 is a schematic representation for describing a sheet-like board member according to the present invention.
Figure 17:
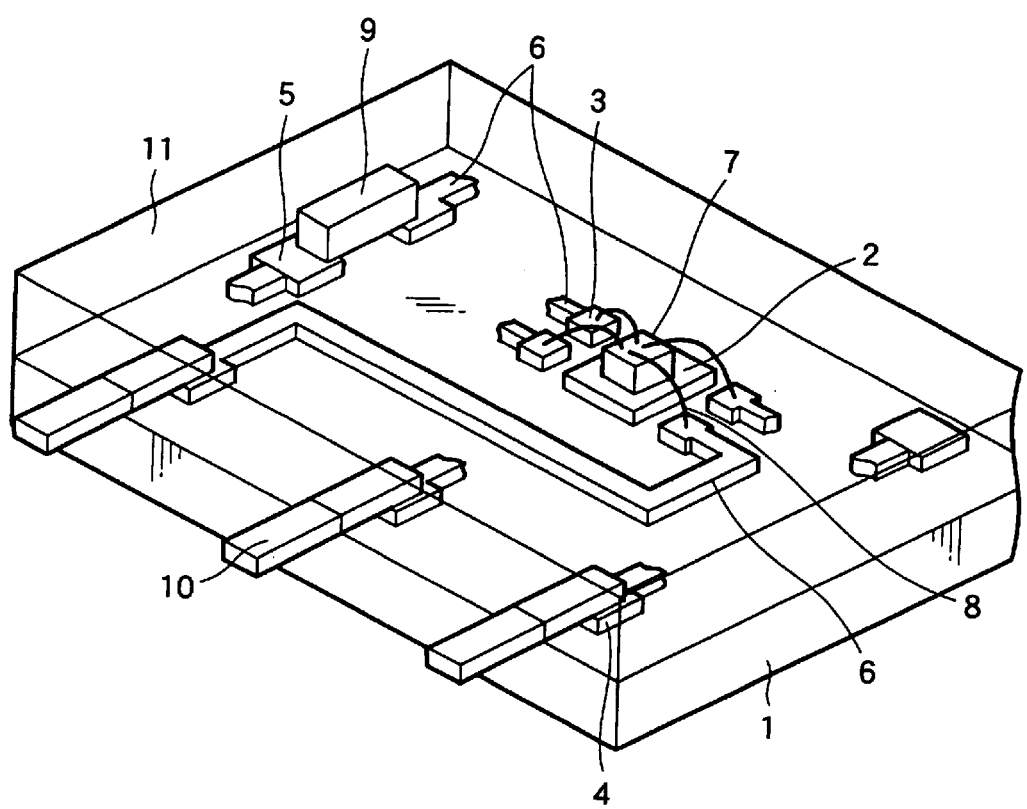
FIG. 17 is an illustration for describing the structure of a known hybrid IC mounted on a board.
Figure 18A:
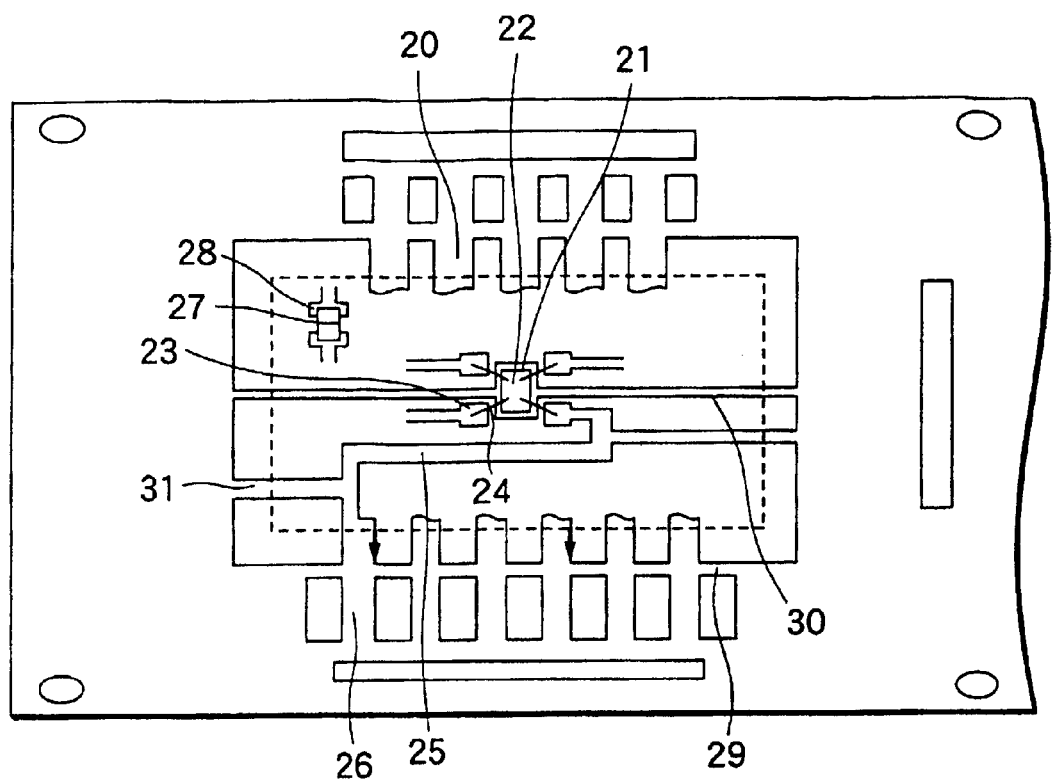
FIGS. 18A and 18B are illustrations for describing a hybrid IC employing a known lead frame according to the present invention.
Figure 18B:
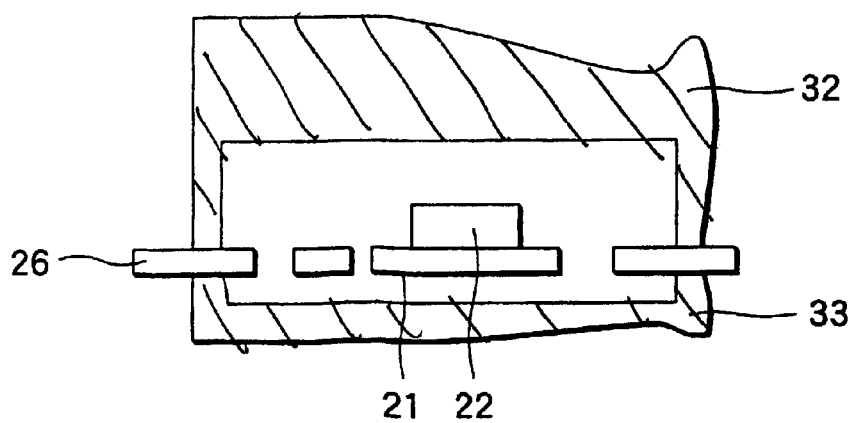

In a semiconductor device shown in FIG. 16, a semiconductor element 243 is mounted on a die pad 240, and a semiconductor element 244 is mounted on a die pad 241. Further, a semiconductor element 245 is mounted on a die pad 242. First pads 246 and another pad 247 are provided on the semiconductor device. The pad 247 is provided for maintaining the three die pads 240 to 242 at the same electric potential.

As is evident from the foregoing description, bonding wires are provided for electrically interconnecting electrodes of the semiconductor elements and bonding pads. Simultaneously, the bonding wires can be used as a crossover to be used at a location where interconnection would arise if electrodes of the semiconductor elements and bonding pads were interconnected through use of wirings.

If a sheet-like board member is coated with a conductive coating film of a low etch rate and is subjected to half etching by using the conductive coating film, an anvil-shaped and curved structure can be formed, as a result of which the sheet-like board member can produce an anchoring effect. This can be applied to all of the embodiments.

For example, if a Cu foil is coated with Ni, Cu or Ni can be etched simultaneously through use of ferric chloride or cupric chloride. Because of a difference in etch rate between Ni and Cu, Ni constitutes an anvil-shaped structure. Thus, coating of a Cu foil with Ni is preferable.

Since an underside of a semiconductor chip is directly exposed or an island is exposed, a semiconductor chip can be thermally coupled to a conductive path provided on a board, thereby improving the heat dissipation characteristic of a semiconductor device. Thus, the temperature of a semiconductor chip can be decreased, and the drive performance of the semiconductor chip can be increased correspondingly.

For example, power MOSS, IGBTs, SITs, heavy-current drive transistors, and heavy-current drive IC memory elements (for example, ICs of MOS type, BIP type, and Bi-CMOS type) are preferable.

As is evident from the foregoing descriptions, a sheet-like board member according to the present invention has a structure which enables half etching of a conductive pattern by using a conductive coating film or photoresist film. Further, the sheet-like board member can be formed as a conductive pattern of a hybrid IC, by means of stopping pressing or etching of the board member at an intermediate position, without involvement of full pressing or etching of the board member from front to back. The structure which enables half etching contributes to a reduction in a pitch between conductive patterns and enables formation of a finer hybrid IC pattern. Since first pads, die pads, and wirings are integrally formed with a board member, warpage or deformation of wirings can be prevented, thereby obviating a tie bar or suspension leads. Moreover, after the board member has been fully encapsulated in insulating plastic, conductive patterns can be separated by means of abrading or etching the underside of the board member. As a result, conductive patterns can be formed in predetermined positions without involvement of positional displacements. Even when wirings are routed over a long distance, which is a characteristic unique to a hybrid IC, the wirings can be formed in position without involvement of any problem.

Since the entirety of the conductive patterns are placed within an area which is to be encapsulated in plastic, there can be prevented occurrence of burrs, which would otherwise arise between leads under the known manufacturing method.

Since the pattern of guide holes identical in shape with guide pins is formed, the pattern of guide holes can be opened for guide pins when the board is encapsulated in insulating plastic. So long as the pattern of guide holes is formed for guide pins beforehand, the pattern can be set in guide pins provided on a sealing metal mold, thereby enabling highly-precise plastic molding operation.

In a case where the board member is primarily formed from Cu and where a conductive coating film is made of Ni, Ag, Au, or Pd, the conductive coating mask can be utilized as an etching mask. Moreover, in a case where the board member is subjected to half etching, the side surface of a conductive pattern can be formed so as to assume a curved structure, or an anvil-shaped structure can be formed in the vicinity of the surface of a conductive pattern from the conductive coating film. Thus, the half-etched board member is imparted with an anchoring effect. Therefore, exfoliation of conductive patterns from the underside of the insulating plastic can be prevented.

Since die pads themselves are formed integrally with a sheet-like board member, the die pads can be formed without use of suspension leads.

A semiconductor device formed from a sheet-like board member is manufactured from the minimum required number of elements, such as a semiconductor element, conductive paths such as conductive patterns, and insulating plastic. Therefore, a semiconductor device is manufactured without involvement of wastage of resources. Accordingly, there can be embodied a semiconductor device which enables a significant reduction in manufacturing costs. There can be realized a very compact semiconductor device which is of lower profile and lighter weight, by means of setting the thickness of a conductive foil to an optimum value.

Since only the undersides of conductive patterns are exposed through insulating plastic, the undersides of the conductive patterns can be used directly for connection with the outside. Thus, the present invention yields an advantage of obviating formation of through holes, as the purpose of forming through holes is achieved by a flexible sheet of known structure.

In a case where a semiconductor element is mounted directly on a die pad by using a conductive coating film, such as a brazing material, Au, or Ag, the underside of the die pad is exposed, and hence the heat developing in a semiconductor element can be transferred directly to a board by using the die pad. Particularly, the head dissipation characteristic of the sheet-like board member enables mounting of a power element.

In the semiconductor device according to the present invention, the surface of an isolation trench is at substantially the same level ass the surface of a conductive pattern. Therefore, even when a narrow-pitch QFP is mounted on a board, a semiconductor element can be moved in its present form in a horizontal direction. Thus, misregistration of outer lead electrodes can be corrected very easily.

The side surface of a conductive pattern assumes a curved structure, and an anvil-shaped structure is formed in the vicinity of the surface of the conductive pattern. Accordingly, the conductive pattern can produce an anchoring effect, thereby preventing warpage or exfoliation of a conductive pattern.

A sheet-like board member supports the entirety thereof until the sheet-like board member is encapsulated in insulating plastic. At the time of separation of conductive patterns and dicing of the sheet-like board member, the insulating plastic acts as a support board. Accordingly, as described in connection with the background art, a support board such as a flexible sheet can be obviated, wherewith a semiconductor package can be manufactured at lower cost.

What is claimed is:

1. A sheet-like board member comprising:

a first planar surface;

a second planar surface disposed opposite to the first surface, said second planar surface including at least one unit each having a plurality of semiconductor element mount regions defined thereon;

a mask disposed on the second planar surface and having respective patterns corresponding to a plurality of first pads formed in or in the vicinity of the semiconductor element mount regions, said mask comprising a conductive film, and guide holes into which guide pins are inserted, wherein each unit includes a plurality of first pads defined by the respective patterns in the unit and a plurality of die pads defined by the respective semiconductor element mount regions in the unit, wherein the conductive film is disposed in the semiconductor element mount regions to form the die pads.

2. A method of manufacturing a semiconductor device comprising:

preparing a sheet-like board member as defined in claim 1, partially etching the second planar surface of the sheet-like member so as to form the first pads;

disposing a circuit element onto a portion on the sheet-like board member;

molding a surface of the sheet-like board member by an insulating resin so that the sheet-like board member is covered, wherein the sheet-like board member is fixed by means of vacuum suction.

3. A sheet-like board member comprising:

a first planar surface;

a second planar surface disposed opposite to the first planer surface, the second surface including at least one unit each of which includes protuberances and semiconductor mount regions formed on said second planar surface; and guide holes into which guide pins are inserted, wherein the protuberances define a plurality of first pads in or in the vicinity of the semiconductor element mount regions defined on the second planar surface, and wherein each unit includes a plurality of die pads defined by the respective semiconductor mount regions in the unit, wherein the protuberances comprise the die pads provided in the semi-conductor element mount region.

4. A method of manufacturing a semiconductor device comprising:

preparing a sheet-like board member as defined in claim 1;

disposing a circuit element onto a portion of the protuberances of the sheet-like board member;

molding a surface of the sheet-like board member by an insulating plastic so that the sheet-like board member is covered, wherein the sheet-like board member is fixed by means of vacuum suction.

5. A sheet-like board member comprising:

a first planar surface;

a second planar surface disposed opposite to the first surface, said second planar surface having at least one unit each of which has semiconductor element mount regions defined thereon;

a mask for etching disposed on the second planar surface and having patterns corresponding to a plurality of first pads formed in or in the vicinity of the semiconductor element mount regions, wherein each unit comprises a plurality of the patterns, and guide holes into which guide pins are inserted, wherein each unit includes a plurality of die pads defined by the respective semiconductor mount regions in the unit, wherein the mask comprises a conductive film wherein the conductive film is disposed in the semiconductor element mount region to form a die pad.

6. A method of manufacturing a semiconductor device comprising:

preparing a sheet-like board member, wherein the sheet-like board member comprises:

a planar surface defining at least one unit;

a sheet-like front side of predetermined thickness which is provided on the planar surface;

a plurality of first pads formed in each unit in or in the vicinity of semiconductor element mount regions defined in each unit on the planar surface;

protuberances in each unit formed on said planar surface and including wirings integrally formed with the first pads, said plurality of first pads and said protuberances formed within an abutting region defined on said planar surface, said abutting region provided to contact with an upper metal mold; and guide holes into which guide pins are inserted wherein each unit includes a plurality of die pads defined by the respective semiconductor mount regions in the unit, and wherein a positioning mark is provided on the sheet-like board member; disposing a circuit element onto a portion of the protuberances of the sheet-like board member;

molding a surface of the sheet-like board member by an insulating plastic so that the sheet-like board member is covered, wherein the sheet-like board member is fixed by means of vacuum suction.

* * * * *